(12) United States Patent
Kanaya et al.

(10) Patent No.: US 7,714,664 B2
(45) Date of Patent: May 11, 2010

(54) CASCODE CIRCUIT

(75) Inventors: Ko Kanaya, Tokyo (JP); Seiki Goto, Tokyo (JP); Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/421,664

(22) Filed: Apr. 10, 2009

(65) Prior Publication Data

US 2010/0060362 A1 Mar. 11, 2010

(30) Foreign Application Priority Data

Sep. 11, 2008 (JP) ............... 2008-232803

(51) Int. Cl.
*H03F 3/04* (2006.01)
(52) U.S. Cl. .................. 330/311; 330/302; 330/296
(58) Field of Classification Search ............. 330/311, 330/302, 296
See application file for complete search history.

(56) References Cited

U.S. PATENT DOCUMENTS

| | | | |
|---|---|---|---|
| 6,218,906 B1 * | 4/2001 | Lohninger ............ | 330/311 |
| 6,392,492 B1 * | 5/2002 | Yuan .................. | 330/311 |
| 6,515,547 B2 * | 2/2003 | Sowlati ............... | 330/311 |
| 6,636,119 B2 | 10/2003 | Vathulya | |
| 7,071,786 B2 | 7/2006 | Inoue et al. | |
| 7,242,253 B2 * | 7/2007 | Motta et al. ........... | 330/311 |
| 7,425,865 B2 * | 9/2008 | Bromberger ........... | 330/252 |
| 2007/0075784 A1 * | 4/2007 | Pettersson et al. ...... | 330/311 |

FOREIGN PATENT DOCUMENTS

| | | | |
|---|---|---|---|
| JP | 2002-359530 A | 12/2002 |
| JP | 2003-218635 A | 7/2003 |
| JP | 2004-516737 A | 6/2004 |
| JP | 2005-033650 A | 2/2005 |
| JP | 2006-094332 A | 4/2006 |

\* cited by examiner

*Primary Examiner*—Patricia Nguyen
(74) *Attorney, Agent, or Firm*—Leydig, Voit & Mayer, Ltd.

(57) ABSTRACT

A cascode circuit for a high-gain or high-output millimeter-wave device that operates with stability. The cascode circuit including two cascode-connected transistors includes: a first high electron mobility transistor (HEMT) including a source that is grounded; a second HEMT including a source connected to a drain of the first HEMT; a reflection gain restricting resistance connected to the gate of the second HEMT, for restricting reflection gain; and an open stub connected to a side of the reflection gain restricting resistance which is opposite the side connected to the second HEMT, for short-circuiting high-frequency signals at a predetermined frequency and nearby frequencies.

16 Claims, 27 Drawing Sheets

UNIT: dBm

CASCODE CIRCUIT

BACKGROUND OF THE INVENTION

1. Field of the Invention

The present invention relates to a cascode circuit used at a millimeter-wave band.

2. Description of the Related Art

In recent years, the range of application using radio waves at the millimeter-wave band such as a 60 GHz band wireless personal area network (WPAN) and a 76 GHz band millimeter-wave radar is widened. In association with this, a millimeter-wave device is required to have high gain and high output.

A generally known method to improve power gain is to cascode-connect transistors. Cascode connection is to connect to a drain of a source-grounded transistor a gate-grounded transistor. A circuit formed in this way is referred to as a cascode circuit.

A typical conventional cascode circuit is described in the following with reference to the attached drawings.

FIG. 24 is a circuit diagram illustrating a conventional cascode circuit.

In FIG. 24, a drain of a first transistor 51 a source of which is grounded is connected to a source of a second transistor 52 a gate of which is grounded. In order to ground a high-frequency signal, a gate of the second transistor 52 is grounded through a MIM capacitor 53. A gate of the first transistor 51 is connected to an input terminal while a drain of the second transistor 52 is connected to an output terminal.

It is to be noted that, although the cascode circuit illustrated in FIG. 24 is described in the context that high electron mobility transistors (HEMTs) are used as the transistors, the same can be said in a case in which hetero-junction bipolar transistors (HBTs) or the like are used. In this case, a base-grounded transistor is connected to a collector of an emitter-grounded transistor. In the following, a drain, a gate, and a source of an HEMT shall be able to be replaced by a collector, a base, and an emitter of an HBT, respectively.

As described above, a high-frequency signal at the gate of the second transistor 52 is grounded through the MIM capacitor 53. However, at the millimeter-wave band, the inductance of wiring connected to the MIM capacitor 53 and a parasitic inductance of a via hole can not be neglected. Therefore, a high-frequency signal at a desired frequency is short-circuited through a parasitic component. Therefore, there is a problem that, at the millimeter-wave band, even if the transistors are cascode-connected, the gain can not be satisfactorily improved.

Here, as an example, frequency characteristics of a maximum available gain (MAG) in a single emitter-grounded HBT and in a cascode-connected HBT are illustrated in FIG. 25.

With reference to FIG. 25, for example, at a microwave band of 10 GHz or the like, by cascode-connecting HBTs, the power gain is larger than that of the single HBT by about 10 dB. However, at the millimeter-wave band, as the frequency increases, the difference between the power gain of the cascode-connected HBT and the power gain of the single HBT becomes smaller. In particular, at a high-frequency band such as a 60 GHz band, a 76 GHz band, or the like, even a cascode circuit can not obtain a satisfactory gain.

It is to be noted that another method of improving the power gain is to continuously connect single transistors in series to increase the gain. However, this method has a problem that, as the number of the transistors and the number of peripheral circuits increase, the chip area increases and the cost increases as well.

In order to solve the above-mentioned problems, for example, the following can be referred to.

In a cascode circuit described in Japanese Patent Application Laid-open No. 2002-359530, as illustrated in FIG. 26, a first transistor 51 and a second transistor 52 are cascode-connected, and an open stub 54 having a length of about ¼ the wavelength of a signal at an operating frequency is connected to a gate of the second transistor 52.

Here, because, at the operating frequency, the gate of the second transistor 52 is grounded at a high frequency by the open stub 54, compared with a case in which a MIM capacitor and a via hole are formed in the vicinity of the gate and grounding is carried out, the parasitic component has less influence, and thus, satisfactory grounding is enabled.

Therefore, at the operating frequency, compared with a case in which the grounding is carried out using a MIM capacitor and a via hole, the power gain can be improved.

However, the conventional art has the following problems.

In the conventional cascode circuit disclosed in Japanese Patent Application Laid-open No. 2002-359530, a reflection gain is caused on an output side.

Here, as an example, FIG. 27 illustrates frequency characteristics of a reflection gain/loss on an output side in a single HEMT, a cascode circuit in which a gate of a second transistor is grounded through a MIM capacitor (see FIG. 24), and a cascode circuit disclosed in Japanese Patent Application Laid-open No. 2002-359530 in which a gate of a second transistor is grounded through an open stub (see FIG. 26).

In FIG. 27, the cascode circuit grounded through a MIM capacitor has a reflection gain at a frequency band of about 20-90 GHz. The cascode circuit grounded through an open stub has a reflection gain at a frequency band of about 70 GHz or more.

When the cascode circuit has a reflection gain, unnecessary oscillation is caused. If the cascode circuit is applied to, for example, an amplifier, there is a problem that stable normal operation may not be expected.

Further, if the cascode circuit is applied to, for example, an oscillator, there is a problem that satisfactory output may not be expected.

SUMMARY OF THE INVENTION

The present invention has been made to solve the above-mentioned problems, and an object of the present invention is to provide a cascode circuit which can realize a high-gain or high-output millimeter-wave device that operates with stability at the millimeter-wave band.

According to the present invention, a cascode circuit including two cascode-connected transistors includes: a first transistor including one of a source and an emitter being grounded; a second transistor including one of a source and an emitter being connected to one of a drain and a collector of the first transistor; a signal improving circuit connected to one of a gate and a base of the second transistor, for improving and outputting an input signal; and a filter circuit connected to a side of the signal improving circuit which is opposite to the second transistor, for short-circuiting high-frequency signals in a predetermined frequency including the vicinity of the frequency.

In the cascode circuit according to the present invention, the two transistors are cascode-connected, the signal improving circuit is connected to one of the gate and the base of the second transistor, and the filter circuit is connected to a side of the signal improving circuit which is opposite to the second transistor. Here, the signal improving circuit improves an input signal and outputs the signal.

Therefore, by using the cascode circuit, a high-gain or high-output millimeter-wave device can be realized which operates with stability at the millimeter-wave band.

DETAILED DESCRIPTION OF THE PREFERRED EMBODIMENTS

Figure 1:
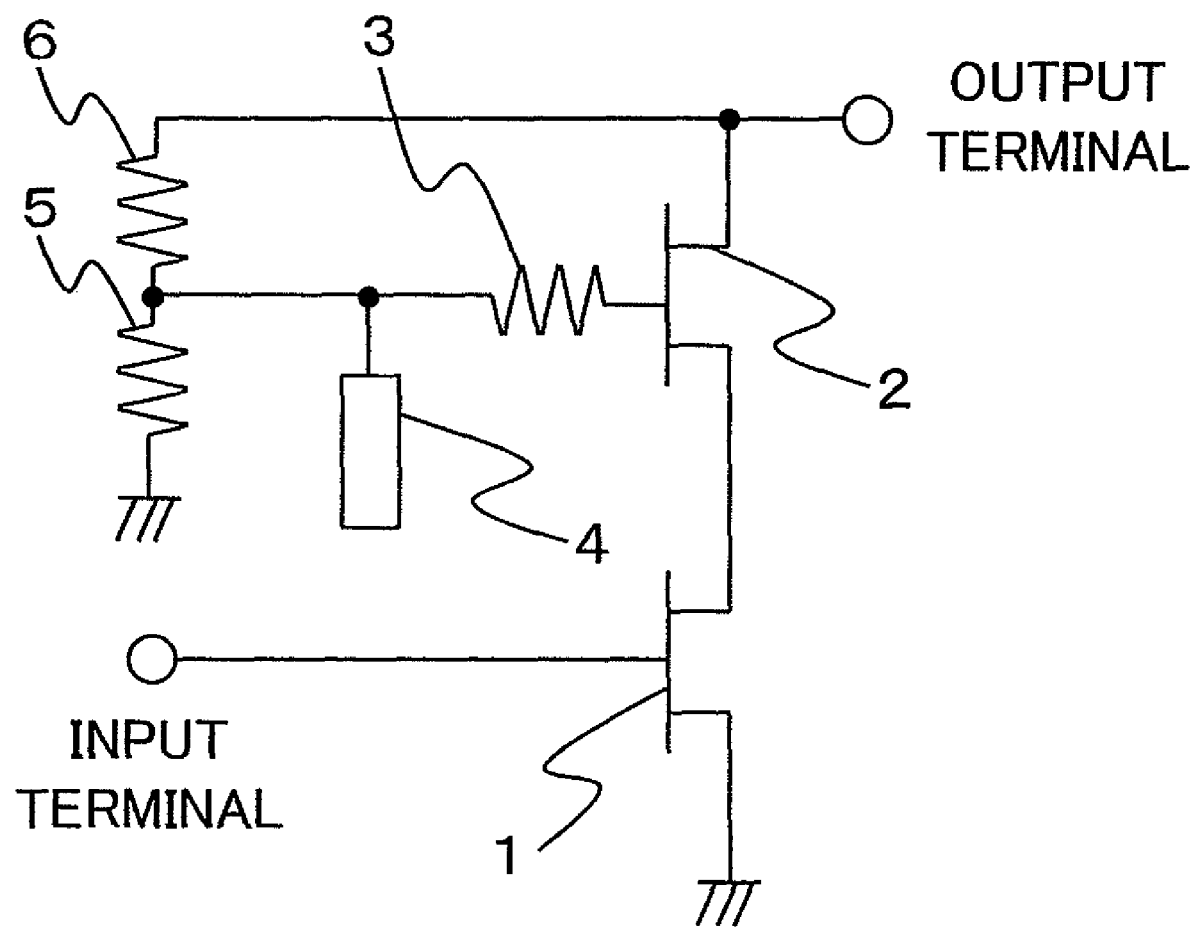
FIG. 1 is a circuit diagram illustrating a cascode circuit according to Embodiment 1 of the present invention.

With reference to the attached drawings, embodiments of the present invention are now described in the following. Throughout the drawings, like reference numerals are used to designate like or identical parts.

Embodiment 1

FIG. 1 is a circuit diagram illustrating a cascode circuit according to Embodiment 1 of the present invention. It is to be noted that the cascode circuit is formed such that its MAG is optimized at 76 GHz (predetermined frequency).

In FIG. 1, a drain of a source-grounded HEMT 1 (first transistor) is connected to a source of a gate-grounded HEMT 2 (second transistor). In other words, the HEMT 1 and the HEMT 2 are cascode-connected. A gate of the HEMT 1 is connected to an input terminal and a drain of the HEMT 2 is connected to an output terminal.

A gate of the HEMT 2 is connected to a reflection gain restricting resistance 3 (signal improving circuit) for restricting a reflection gain. An open stub 4 (filter circuit) for short-circuiting high-frequency signals in the predetermined frequency including the vicinity of the frequency is connected to a side of the reflection gain restricting resistance 3, which is opposite to the HEMT 2. Here, a length of the open stub 4 is set to be shorter than ¼ a wavelength (λ/4) of a high-frequency signal at the predetermined frequency to be used.

Divider resistances 5 and 6 for setting a gate voltage of the HEMT 2 are connected between a source of the HEMT 1 and the gate of the HEMT 2 and between the gate and the drain of the HEMT 2, respectively.

Next, description is made with regard to frequency characteristics of a MAG and a reflection gain/loss in the cascode circuit of the above-mentioned structure when a resistance value of the reflection gain restricting resistance 3 is changed as a parameter.

Figure 2:
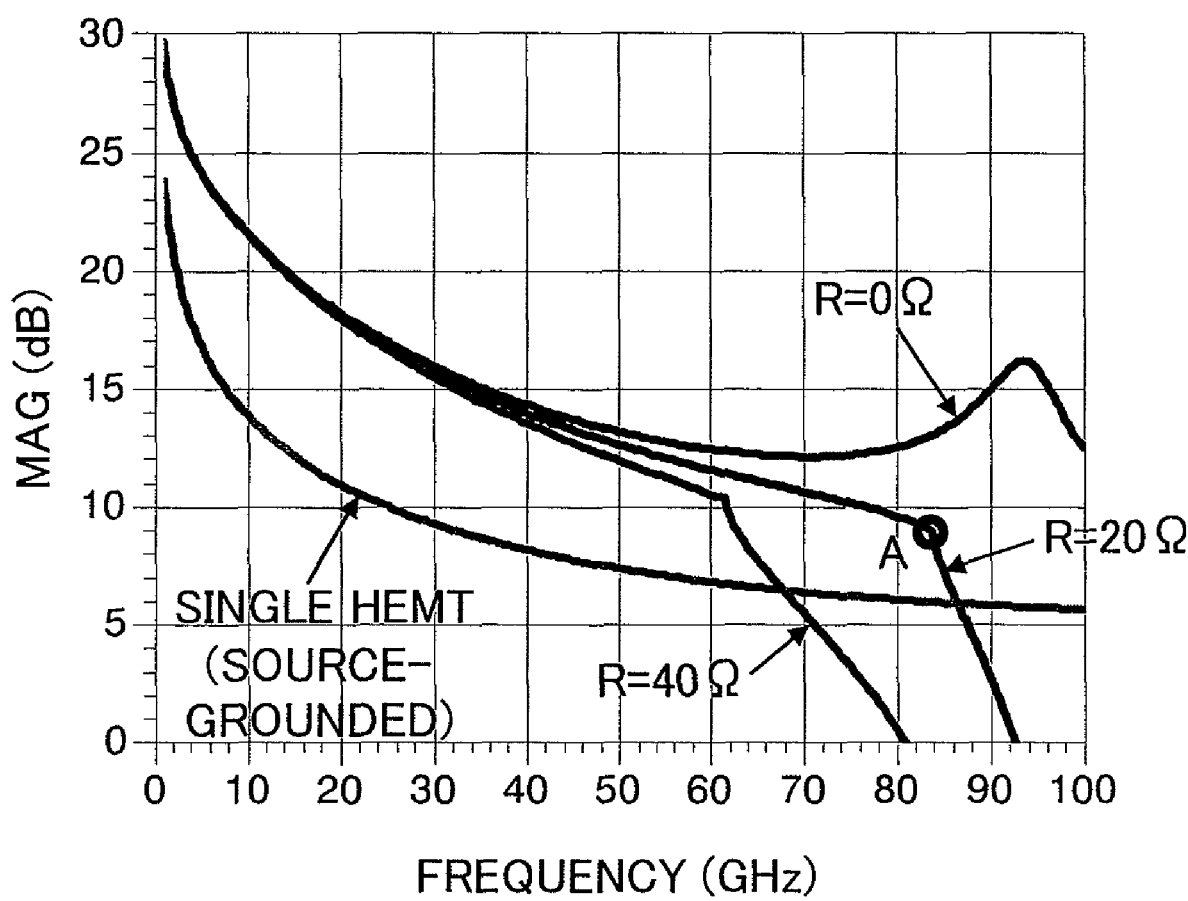
FIG. 2 is an explanatory graph of frequency characteristics of a MAG in the cascode circuit illustrated in FIG. 1 in comparison with a case of a single HEMT.
Figure 3:
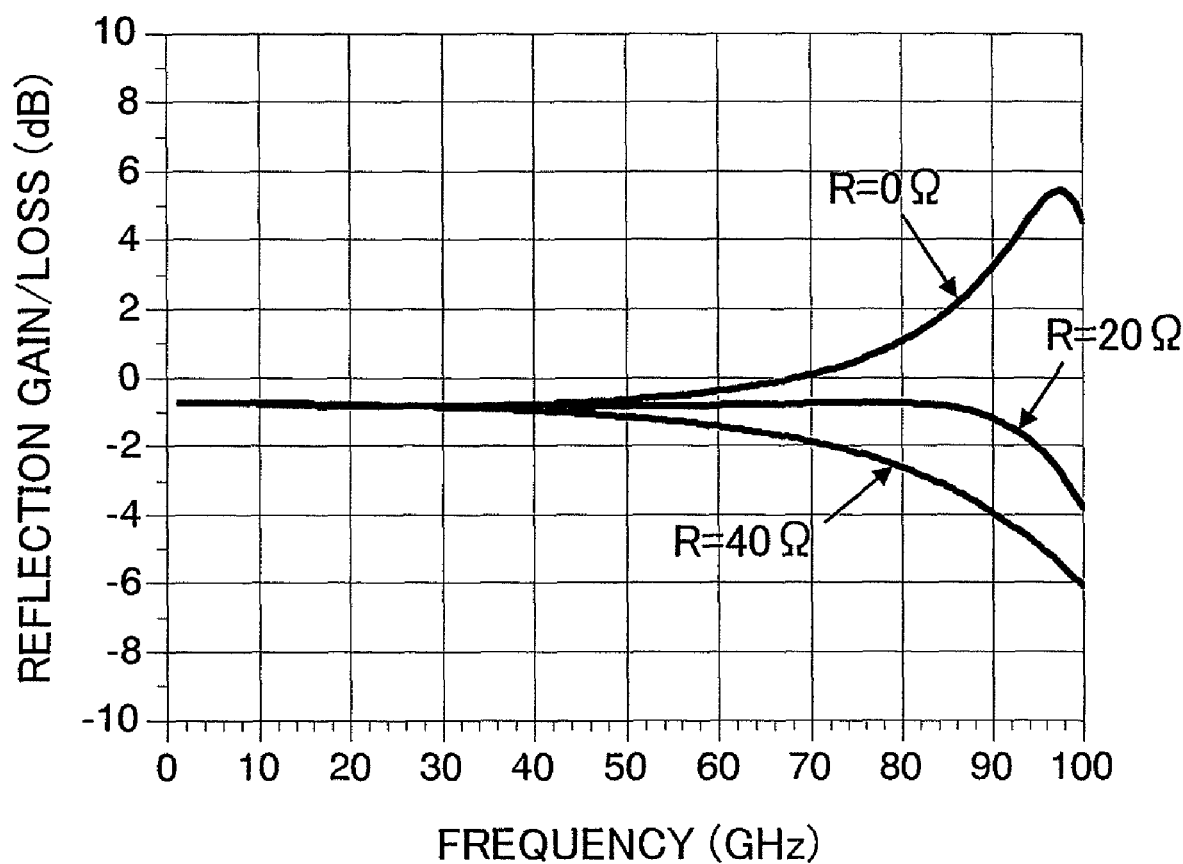
FIG. 3 is an explanatory graph of frequency characteristics of a reflection gain/loss on an output side in the cascode circuit illustrated in FIG. 1.

FIG. 2 is an explanatory graph of frequency characteristics of a MAG in the cascode circuit illustrated in FIG. 1 in comparison with a case of a single HEMT. FIG. 3 is an explanatory graph of frequency characteristics of a reflection gain/loss on an output side in the cascode circuit illustrated in FIG. 1.

In FIGS. 2 and 3, when the resistance value of the reflection gain restricting resistance 3 is 0 Ω, although the MAG is the highest, the reflection gain is caused, and thus, the circuit is unstable. When the resistance value of the reflection gain restricting resistance 3 is 40 Ω, although the reflection gain is not caused, the MAG is lower than that in the case of the single HEMT at about 76 GHz, and thus, the advantage of the cascode circuit is not exploited. Here, when the resistance value of the reflection gain restricting resistance 3 is 20 Ω, the reflection gain is not caused, and at the same time, the MAG is higher than that in the case of the single HEMT at about 76 GHz.

Therefore, by setting the resistance value of the reflection gain restricting resistance 3 to be about 20 Ω, the reflection gain can be restricted, and at the same time, a satisfactory MAG can be obtained.

Further, by setting the length of the open stub 4 to be shorter than λ/4, the MAG can be prevented from being lowered due to the reflection gain restricting resistance 3, that is, a point A indicated in FIG. 2 can be shifted to the higher side with respect to the predetermined frequency.

It is to be noted that the length of the open stub 4 may be ¼ the wavelength of a high-frequency signal at the predetermined frequency to be used.

Further, as apparent from FIGS. 2 and 3, at a frequency band of about 65 GHz or less, the cascode circuit has a higher MAG than that of the single HEMT, and at the same time, the reflection gain is restricted.

Therefore, for example, in an amplifier used at 30 GHz band, the length of the open stub does not necessarily have to be λ/4 at the 30 GHz band. More specifically, insofar as the MAG is higher than that in the case of the single HEMT and the reflection gain is restricted, the length of the open stub may be set to be shorter than λ/4 of a high-frequency signal at the predetermined frequency.

In the cascode circuit according to Embodiment 1 of the present invention, the first transistor and the second transistor are cascode-connected, and the gate of the second transistor is connected to the resistance for restricting the reflection gain. The open stub for short-circuiting high-frequency signals in the predetermined frequency including the vicinity of the frequency is connected to the side of the resistance, which is opposite to the second transistor.

Therefore, a cascode circuit which has a simple structure but still restricts the reflection gain and improves the MAG at a millimeter-wave band can be obtained. Further, even when MAGs of the individual transistors are not satisfactorily high, the cascode connection makes it possible to improve the MAG.

Further, by using the cascode circuit, a high-gain millimeter-wave device can be realized which operates with stability at the millimeter-wave band.

Further, because the structure of the circuit is simple, a chip area does not increase and a cost increase can be prevented.

Further, because the frequency band of the MAG is determined not by the capacitance of a capacitor which varies greatly within a wafer surface but by the length of the stub, variations in the characteristics of the cascode circuit are suppressed and the yield can be improved.

It is to be noted that, although, in Embodiment 1, single-gate HEMTs (HEMTs 1 and 2) are cascode-connected to form the cascode circuit, the present invention is not limited thereto. For example, in an HEMT process, a dual-gate HEMT may be used which is equivalent to a source-grounded HEMT and a gate-grounded HEMT which are cascode-connected to each other.

In this case, the chip area can be decreased.

Further, although, in Embodiment 1, a pair of HEMTs, that is, the HEMT 1 and the HEMT 2, are cascode-connected, the present invention is not limited thereto, and the HEMT 2 may be multistage HEMTs to be connected to the HEMT 1. Here, the multistage HEMTs may be formed by connecting a drain of an HEMT to sources of other HEMTs one after another in series, or, alternatively, by connecting a drain of an HEMT to sources of a plurality of HEMTs in parallel.

In those cases, the gain and the output can be further improved.

Figure 4:
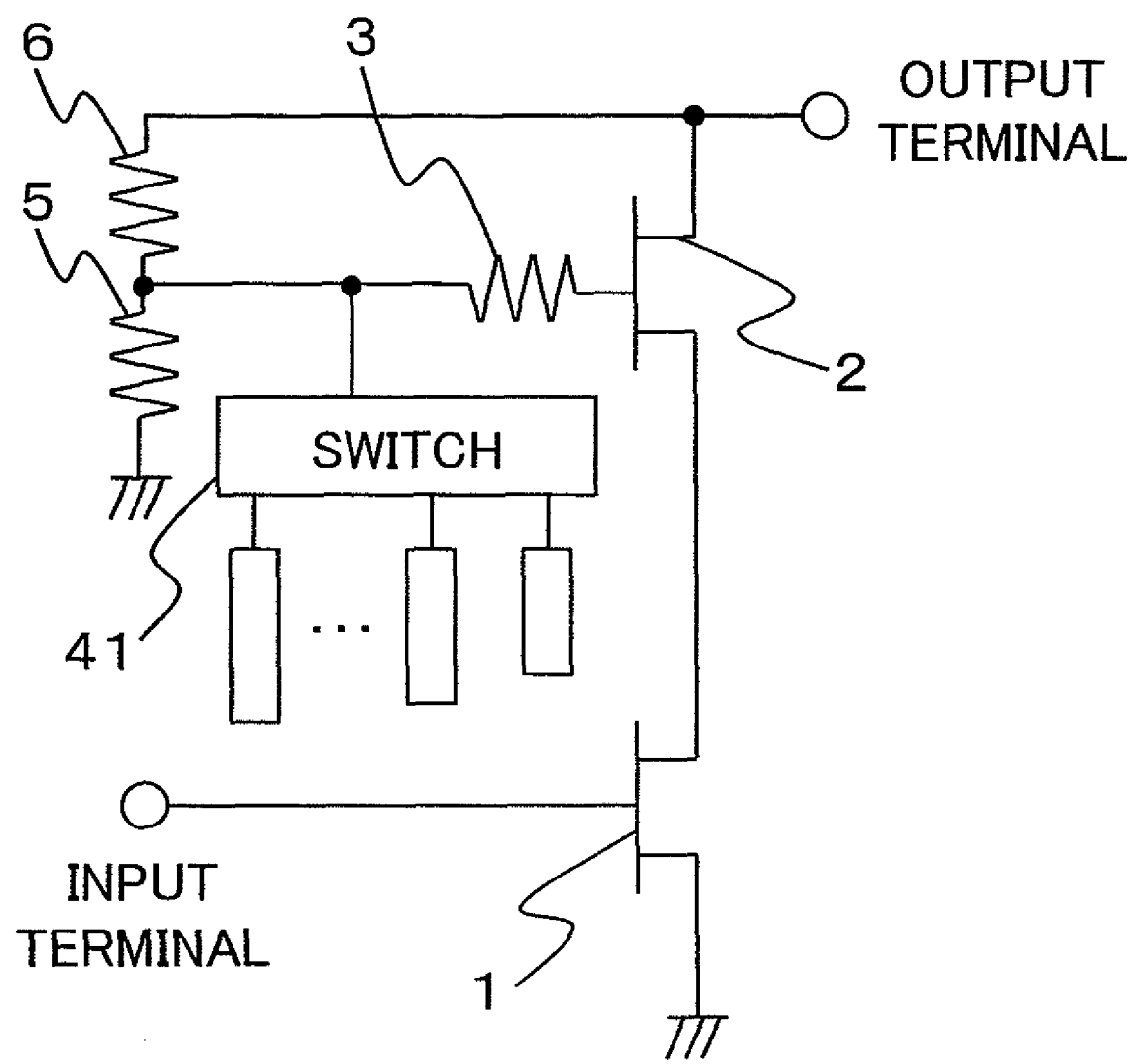
FIG. 4 is a circuit diagram illustrating a structure in which a selector switch is used to select an open stub.
Figure 5:
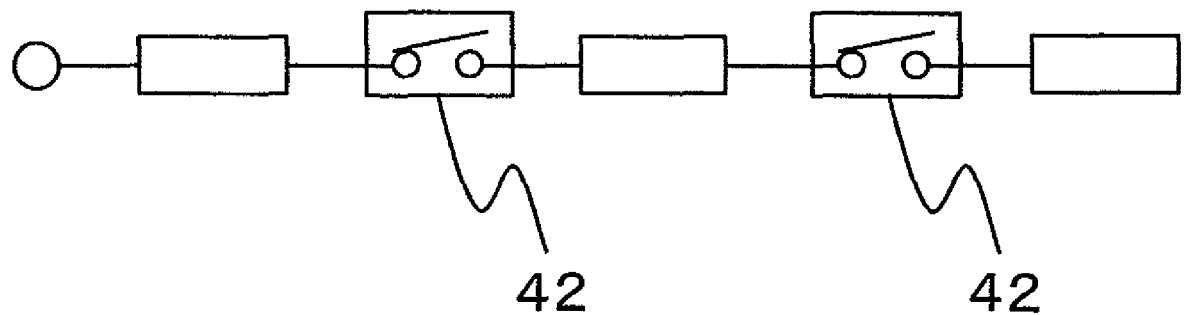
FIG. 5 is a circuit diagram illustrating a variable length stub.

Still further, although, in Embodiment 1, only one open stub 4 is used, the present invention is not limited thereto. As in a cascode circuit illustrated in FIG. 4, a plurality of open stubs may be provided for respective frequency bands to be used, and an appropriate stub may be selected using a selector switch 41. Further, instead of the open stub 4, a variable length stub the length of which can be adjusted by a micro electro mechanical system (MEMS) switch 42 as illustrated in FIG. 5 may be used to change the frequency band to be used.

In those cases, because the MAG can be made high only with regard to a desired band corresponding to the length of the stub, a gain at an unnecessary band can be easily lowered.

Further, although, conventionally, in a multiband system which uses a plurality of frequency bands, a transistor is necessary for each of the bands, by changing the frequency band using the selector switch 41 or the variable length stub, even in a multiband system, operation at the respective bands is enabled with a set of cascode circuits. Therefore, the number of necessary transistors is decreased, and the cost can be decreased.

Further, although, in Embodiment 1, the open stub 4 is used as the filter circuit for short-circuiting a signal at the predetermined frequency, the present invention is not limited thereto. For example, a series resonant circuit may be used in which an inductor and a capacitor are connected in series so as to produce resonance at the predetermined frequency, or a short stub may be used the length of which is ½ the wavelength of a high-frequency signal at the predetermined frequency.

Those cases also have similar effects to those in Embodiment 1.

Embodiment 2

Figure 6:
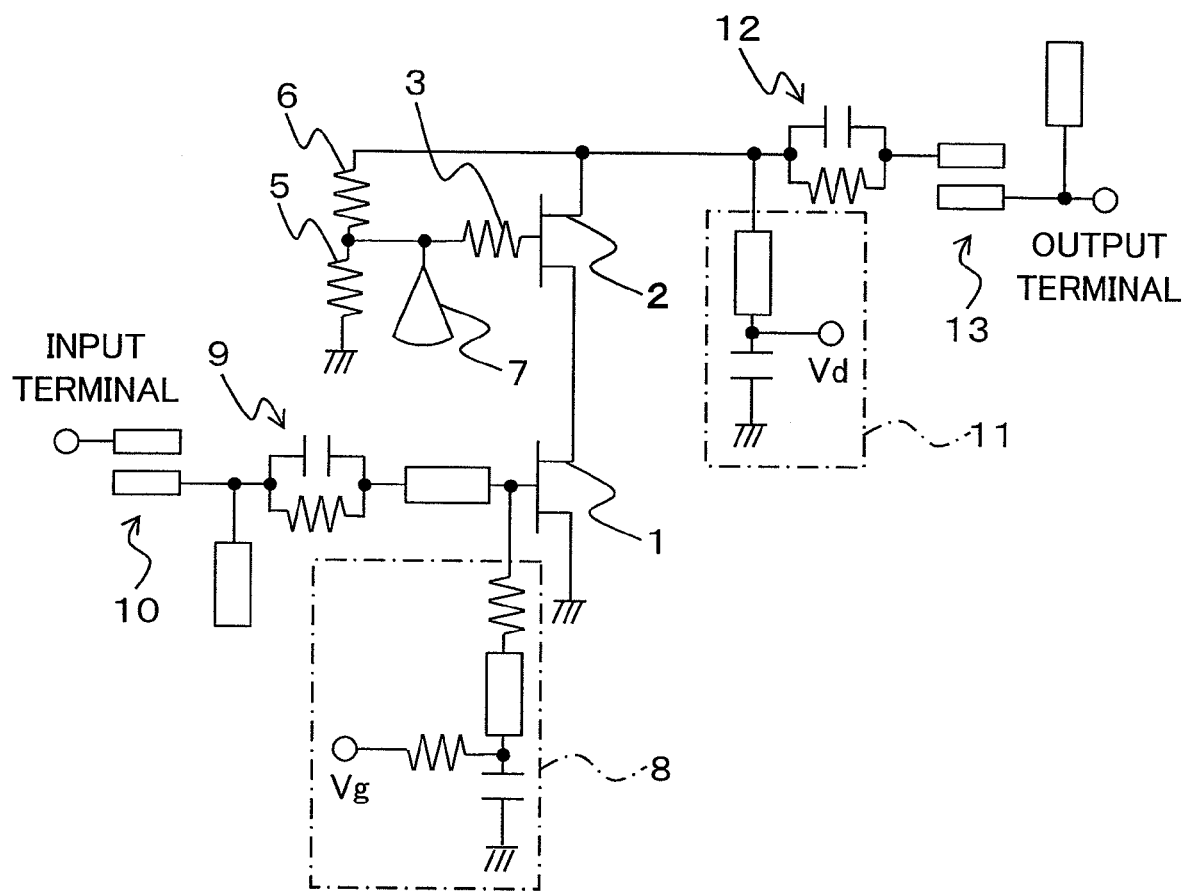
FIG. 6 is a circuit diagram illustrating an amplifier according to Embodiment 2 of the present invention.

FIG. 6 is a circuit diagram illustrating an amplifier according to Embodiment 2 of the present invention. It is to be noted that the amplifier is formed such that its gain is the highest at 76 GHz (predetermined frequency).

In FIG. 6, an HEMT 1 and an HEMT 2 are cascode-connected. A gate of the HEMT 1 is connected to an input terminal and a drain of the HEMT 2 is connected to an output terminal.

A gate of the HEMT 2 is connected to a reflection gain restricting resistance 3 for restricting a reflection gain. Divider resistances 5 and 6 for setting a gate voltage of the HEMT 2 are connected between a source of the HEMT 1 and the gate of the HEMT 2 and between the gate and the drain of the HEMT 2, respectively.

Instead of the linear open stub 4 illustrated in FIG. 1, a fan-shaped radial stub 7 is connected to a side of the reflection gain restricting resistance 3, which is opposite to the HEMT 2. Similarly to the open stub 4, a length of the radial stub 7 is set such that a high-frequency signal at the predetermined frequency is substantially short-circuited at a node. Further, by using the radial stub 7, a high-frequency signal can be short-circuited at the node at a wide band.

A gate bias circuit 8 and a matching circuit including an equalizer 9 and a coupled line 10 are connected between the gate of the HEMT 1 and the input terminal. A drain bias circuit 11 and a matching circuit including an equalizer 12 and a coupled line 13 are connected between the drain of the HEMT 2 and the output terminal.

The gate bias circuit 8 includes a resistance, a transmission line, a capacitor, and a gate bias terminal, supplies a gate bias, and gives stability to operation of the circuit.

The drain bias circuit 11 includes a short stub having a length of λ/4 of a high-frequency signal at the predetermined frequency, a capacitor, and a drain bias terminal, and supplies a drain bias and filters out signals other than a high-frequency signal at the predetermined frequency.

The coupled lines 10 and 13 filter out a direct current signal and a signal at a low-frequency band. The equalizers 9 and 12 lower a gain at a band which can not be filtered out by the coupled lines 10 and 13 and give stability to operation of the circuit.

In the amplifier structured as described above, a signal input to the input terminal is amplified and output from the output terminal.

Next, frequency characteristics of a gain and a reflection gain/loss in the amplifier are described.

Figure 7:
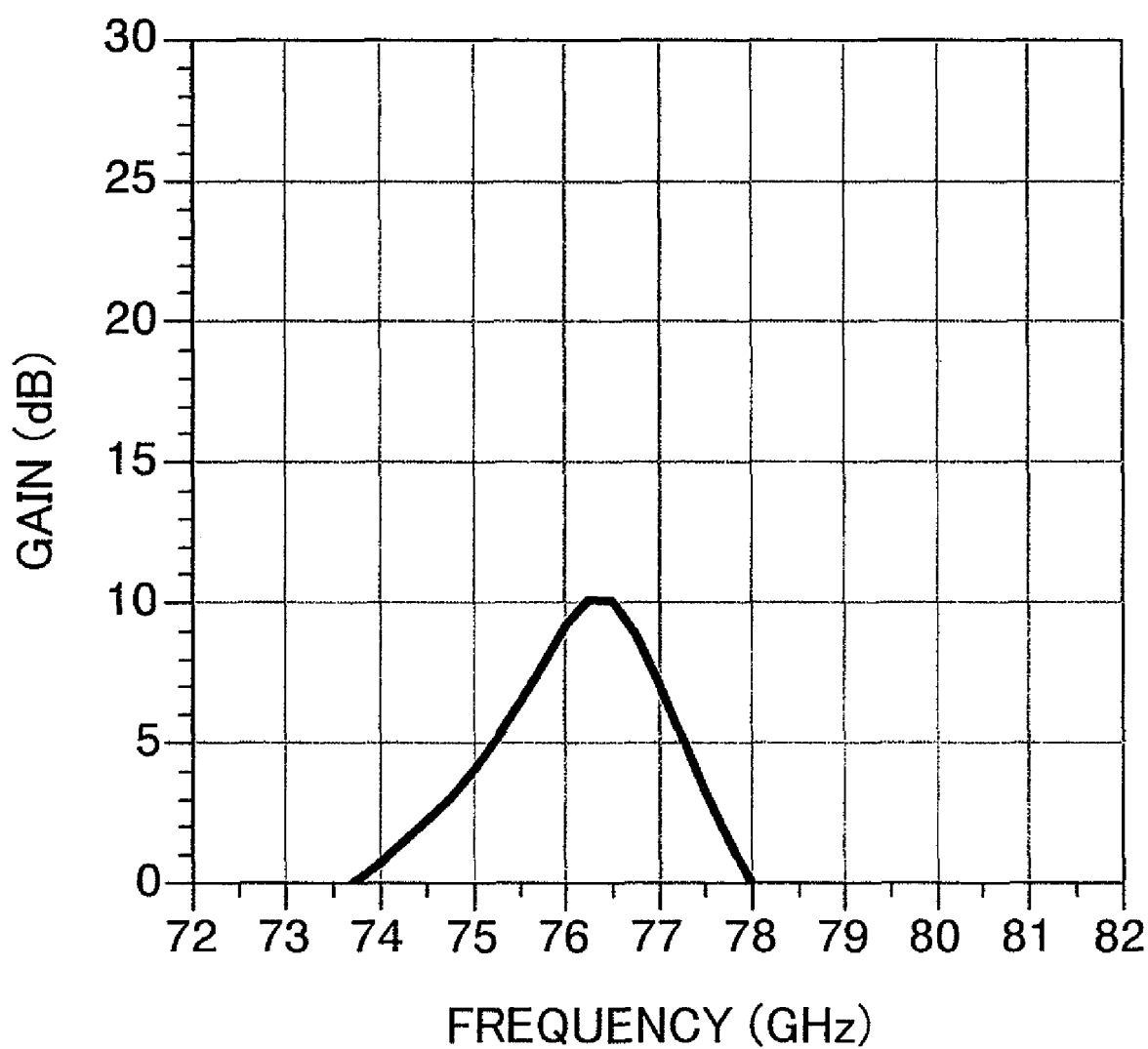
FIG. 7 is an explanatory graph of frequency characteristics of a gain in the amplifier illustrated in FIG. 6.
Figure 8:
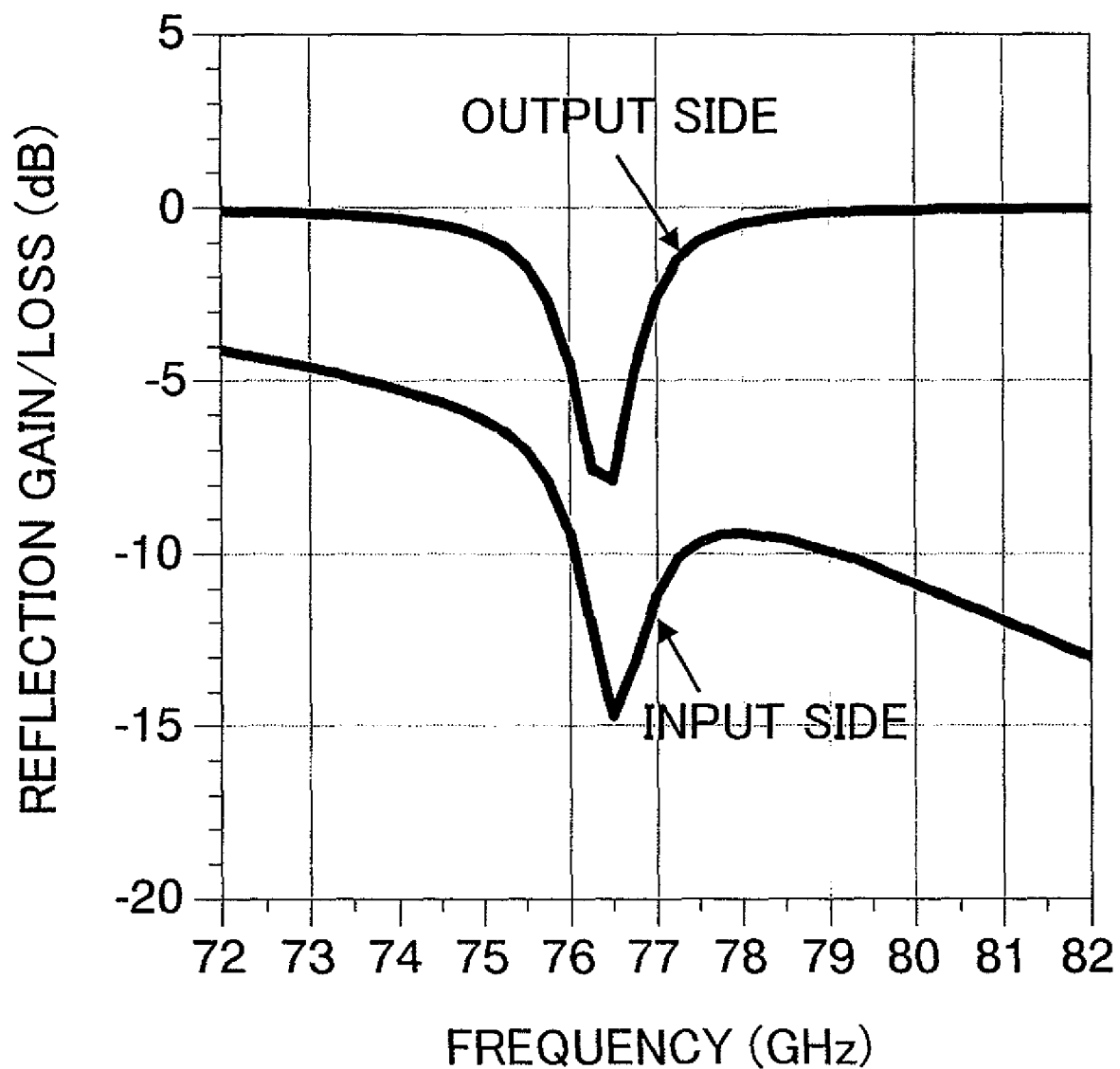
FIG. 8 is an explanatory graph of frequency characteristics of a reflection gain/loss on an input side and on an output side in the amplifier illustrated in FIG. 6.

FIG. 7 is an explanatory graph of the frequency characteristics of the gain in the amplifier illustrated in FIG. 6. FIG. 8 is an explanatory graph of the frequency characteristics of the reflection gain/loss on an input side and on an output side in the amplifier illustrated in FIG. 6.

From FIGS. 7 and 8, it can be seen that, at the predetermined frequency of 76 GHz, the reflection gain can be restricted and a gain as high as about 10 dB can be obtained.

In the amplifier according to Embodiment 2 of the present invention, the first transistor and the second transistor are cascode-connected, and the gate of the second transistor is connected to the resistance for restricting the reflection gain. The radial stub for short-circuiting high-frequency signals in the predetermined frequency including the vicinity of the frequency is connected to the side of the resistance, which is opposite to the second transistor.

Therefore, a high-gain amplifier which restricts the reflection gain at a millimeter-wave band can be obtained.

Embodiment 3

Figure 9:
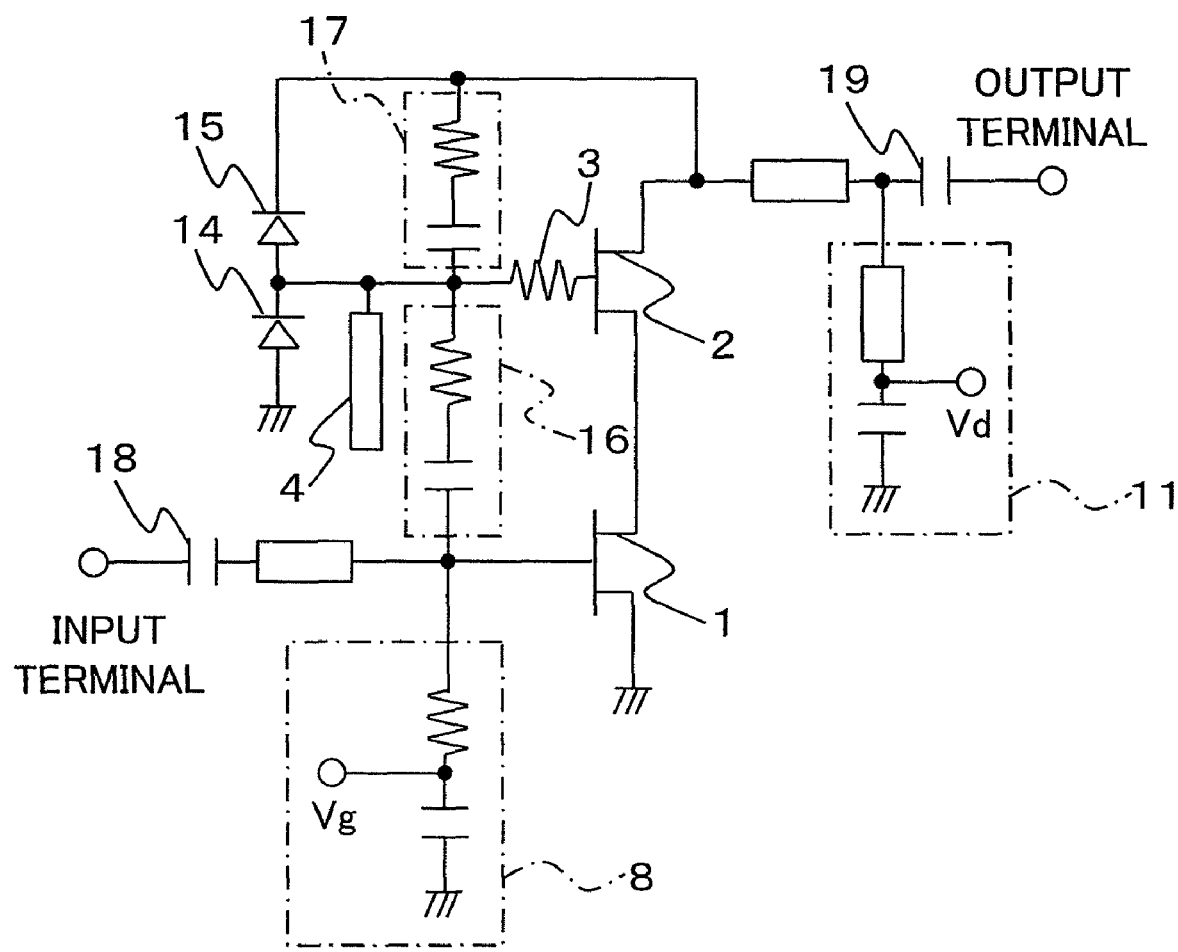
FIG. 9 is a circuit diagram illustrating an amplifier according to Embodiment 3 of the present invention.

FIG. 9 is a circuit diagram illustrating an amplifier according to Embodiment 3 of the present invention. It is to be noted that the amplifier is formed as a wideband amplifier which can be used over a wide band.

In FIG. 9, an HEMT 1 and an HEMT 2 are cascode-connected. A gate of the HEMT 1 is connected to an input terminal and a drain of the HEMT 2 is connected to an output terminal.

A gate of the HEMT 2 is connected to a reflection gain restricting resistance 3 for restricting a reflection gain. An open stub 4 for short-circuiting high-frequency signals in a predetermined frequency including the vicinity of the frequency is connected to a side of the reflection gain restricting resistance 3, which is opposite to the HEMT 2. Here, a length of the open stub 4 is set to be shorter than ¼ the wavelength (λ/4) of a high-frequency signal at the predetermined frequency to be used (for example, 76 GHz).

Instead of the divider resistance 5 illustrated in FIG. 1, a first diode 14 is connected between a source of the HEMT 1 and the gate of the HEMT 2. An anode of the first diode 14 is grounded and a cathode of the first diode 14 is connected to the gate of the HEMT 2. Further, instead of the divider resistance 6 illustrated in FIG. 1, a second diode 15 is connected between the gate and the drain of the HEMT 2. An anode of the second diode 15 is connected to the gate of the HEMT 2 and a cathode of the second diode 15 is connected to the drain of the HEMT 2.

Because a reverse bias voltage is applied to each of the first diode 14 and the second diode 15, the first diode 14 and the second diode 15 can be regarded as resistances having a high resistance value. Here, ordinarily, the divider resistances are required to have a resistance value on the order of several kiloohms. When an epitaxial resistance obtained by an ordinary gallium arsenide (GaAs) wafer is used, a length of the resistance is on the order of several hundred micrometers.

On the other hand, when a Schottky gate of an HEMT is used to form a diode, the diode can be obtained only by short-circuiting a drain and a source of the HEMT.

Therefore, by using a Schottky diode as a divider resistance, a chip area can be decreased.

It is to be noted that, in the case of, for example, an HBT process, a PN diode between a base and a collector may be used as a divider resistance.

Further, stabilizing circuits 16 and 17 for making the amplifier usable over a wide band are connected between the gate of the HEMT 1 and the gate of the HEMT 2 and between the gate of the HEMT 2 and the drain of the HEMT 2, respectively. Each of the stabilizing circuits 16 and 17 is formed by connecting a resistance and a capacitor in series.

A gate bias circuit 8 and a matching circuit including a capacitor 18 are connected between the gate of the HEMT 1 and the input terminal. A drain bias circuit 11 and a matching circuit including a capacitor 19 are connected between the drain of the HEMT 2 and the output terminal.

The gate bias circuit 8 and the drain bias circuit 11 have functions similar to those of the gate bias circuit 8 and the drain bias circuit 11, respectively, illustrated in FIG. 6. The capacitors 18 and 19 filters out a signal at a low-frequency band.

In the amplifier structured as described above, a signal input to the input terminal is amplified and output from the output terminal.

Next, frequency characteristics of a MAG, a gain, and a reflection gain/loss in the amplifier are described.

Figure 10:
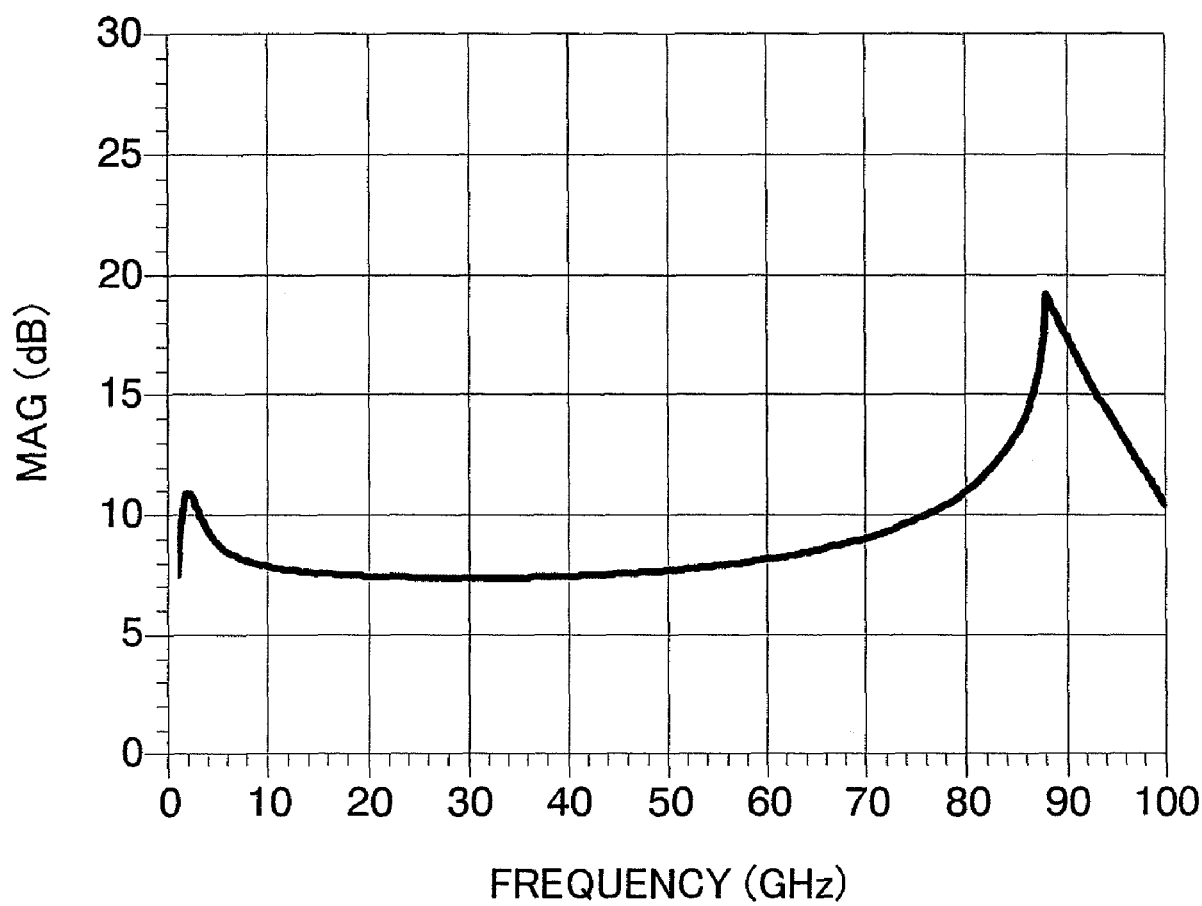
FIG. 10 is an explanatory graph of frequency characteristics of a MAG in the amplifier illustrated in FIG. 9.
Figure 11:
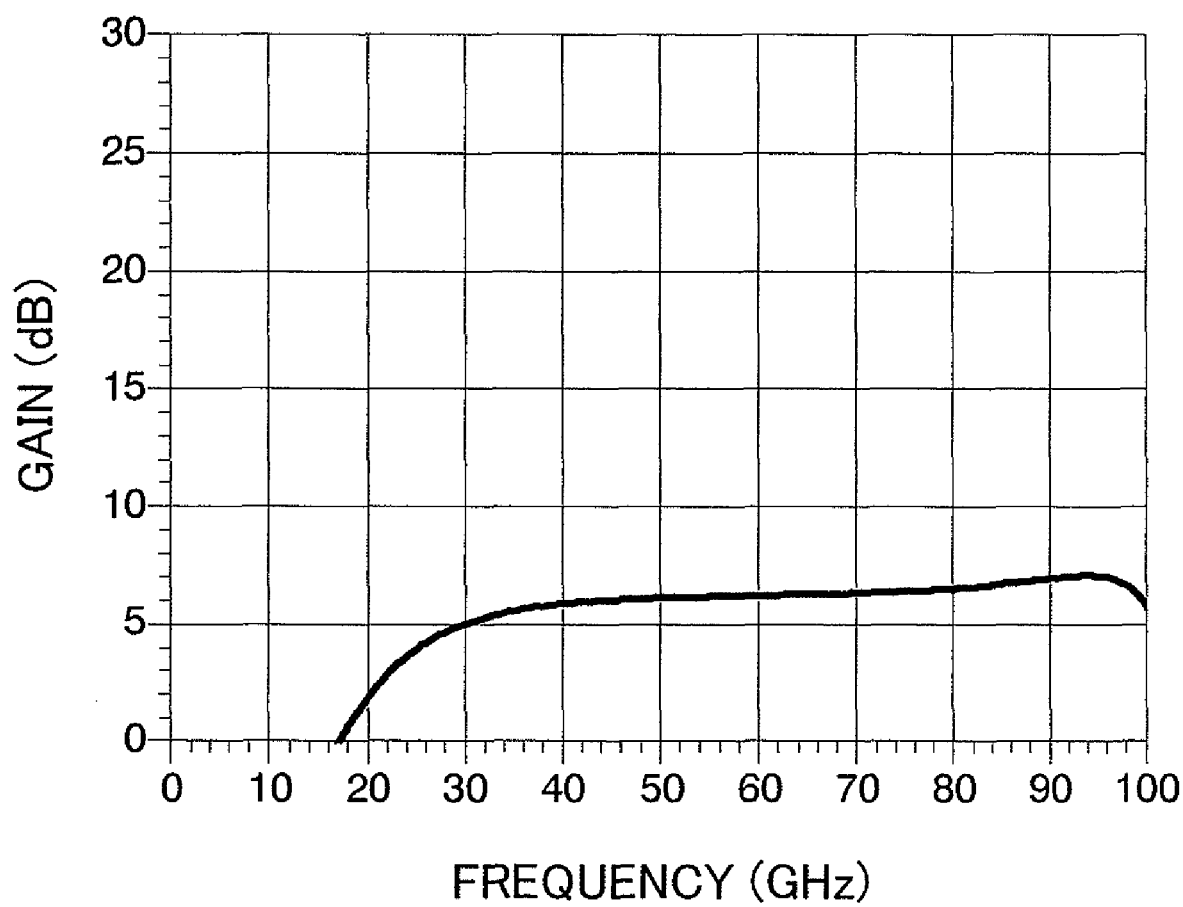
FIG. 11 is an explanatory graph of frequency characteristics of a gain in the amplifier illustrated in FIG. 9.
Figure 12:
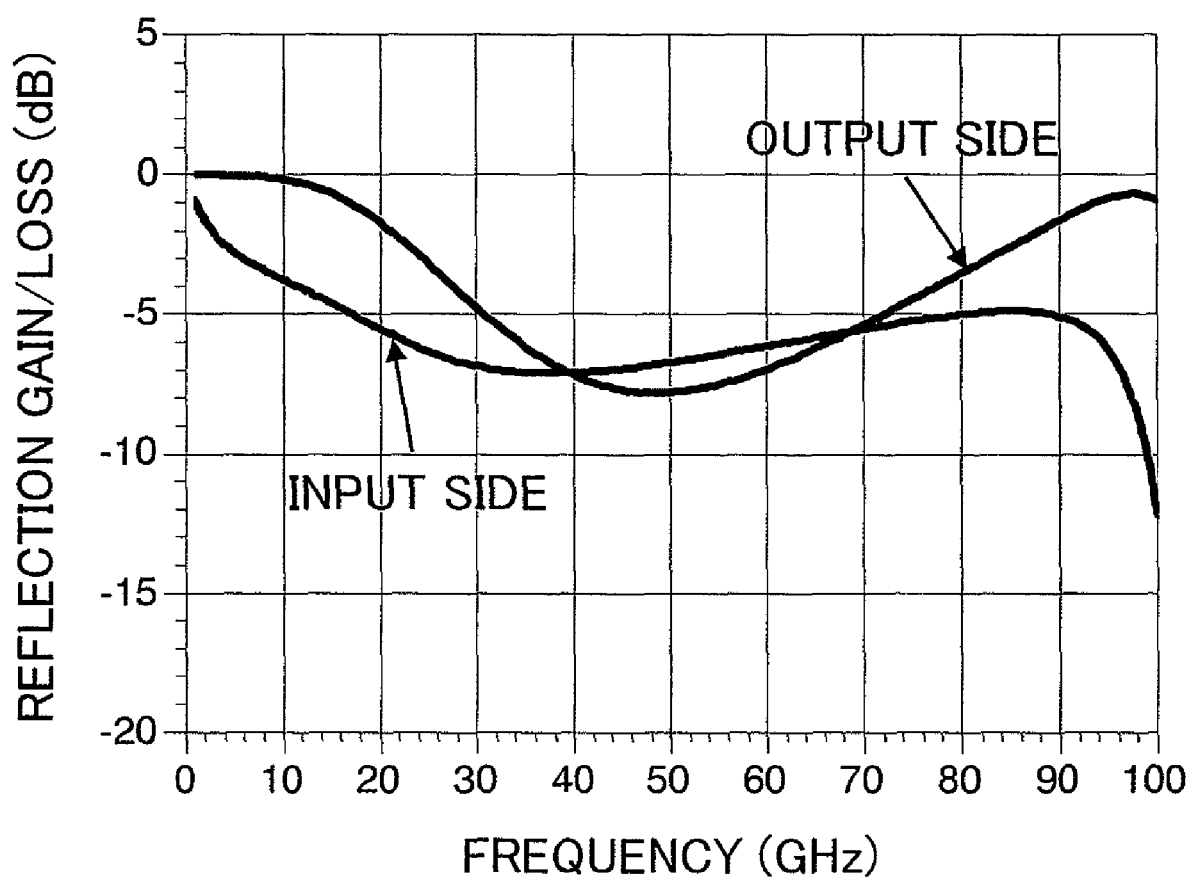
FIG. 12 is an explanatory graph of frequency characteristics of a reflection gain/loss on an input side and on an output side in the amplifier illustrated in FIG. 9.

FIG. 10 is an explanatory graph of frequency characteristics of a MAG in the amplifier illustrated in FIG. 9. FIG. 11 is an explanatory graph of frequency characteristics of a gain in the amplifier illustrated in FIG. 9. FIG. 12 is an explanatory graph of frequency characteristics of a reflection gain/loss on an input side and on an output side in the amplifier illustrated in FIG. 9.

With reference to FIGS. 10 to 12, by virtue of the open stub 4, the MAG is increased at about 90 GHz, while, by virtue of the stabilizing circuits 16 and 17, the MAG is flat from about 30 GHz to about 80 GHz.

Here, the MAG has a gain also at frequency bands of 30 GHz or less and 90 GHz or more. However, because a signal at the low-frequency band of 30 GHz or less is filtered out by the capacitors 18 and 19 and a signal at the high-frequency band of 90 GHz or more is filtered out by the drain bias circuit 11 having a filtering function, the gain of the amplifier has the characteristics as illustrated in FIG. 11.

Further, from FIGS. 10 to 12, it can be seen that a third band as large as 30-90 GHz can be secured and that, at this band, the reflection gain is restricted and a gain as high as 5 dB or more is obtained even at the millimeter-wave band.

Although a typical wideband amplifier has a complicated peripheral circuit such as a pre-matching circuit, the present invention can realize a wideband amplifier with a relatively simple circuit structure and a relatively simple design.

In the amplifier according to Embodiment 3 of the present invention, the first transistor and the second transistor are cascode-connected, and the gate of the second transistor is connected to the resistance for restricting the reflection gain.

The open stub for short-circuiting high-frequency signals in the predetermined frequency including the vicinity of the frequency is connected to the side of the resistance which is opposite to the second transistor.

Further, the stabilizing circuits are connected between the gate of the first transistor and the gate of the second transistor and between the gate of the second transistor and the drain of the second transistor, respectively. Further, a gate bias circuit and a matching circuit are connected between the gate of the first transistor and the input terminal, and another drain bias circuit and another matching circuit are connected between the drain of the second transistor and the output terminal.

Therefore, a high-gain amplifier which restricts the reflection gain over a wide band at the millimeter-wave band can be obtained.

Embodiment 4

Figure 13:
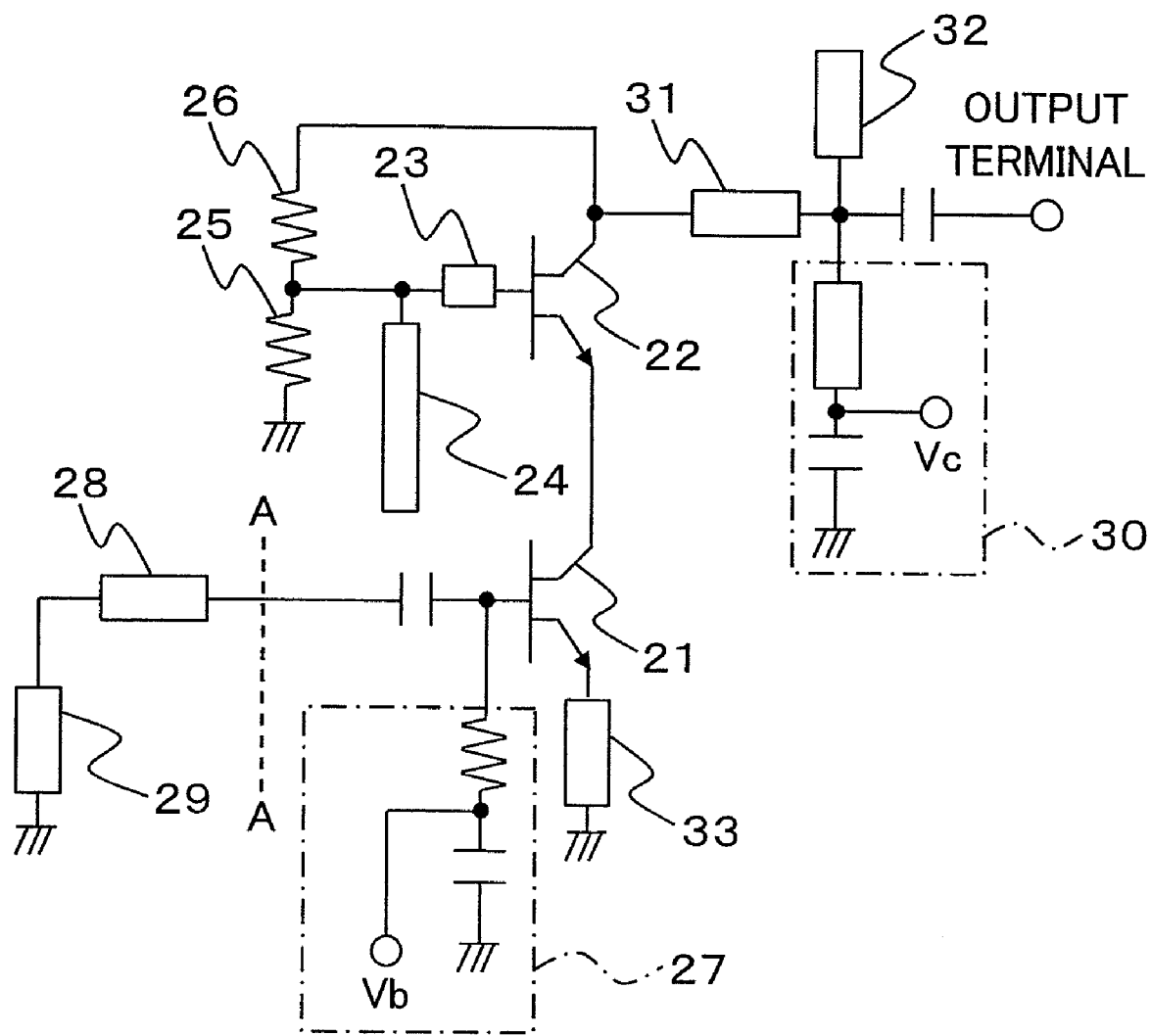
FIG. 13 is a circuit diagram illustrating an oscillator according to Embodiment 4 of the present invention.

FIG. 13 is a circuit diagram illustrating an oscillator according to Embodiment 4 of the present invention. It is to be noted that the oscillator is adapted to output a second harmonic of an oscillation signal.

In FIG. 13, a collector of an emitter-grounded HBT 21 (first transistor) is connected to an emitter of a base-grounded HBT 22 (second transistor). In other words, the HBT 21 and the HBT 22 are cascode-connected. A collector of the HBT 22 is connected to an output terminal.

A base of the HBT 22 is connected to a phase adjusting line 23 (signal improving circuit) for adjusting the phase of an oscillation signal to a desired phase. An open stub 24 for short-circuiting high-frequency signals in a predetermined frequency including the vicinity of the frequency is connected to a side of the phase adjusting line 23 which is opposite to the HBT 22. Here, the length of the open stub 24 is set to be ¼ the wavelength (λ/4) of an oscillation signal the oscillation frequency of which is the predetermined frequency. It is to be noted that, if necessary, an open stub the length of which is λ/4 of a harmonic of an oscillation signal may be additionally connected to the base of the HBT 22.

Divider resistances 25 and 26 for setting a base voltage of the HBT 22 are connected between an emitter of the HBT 21 and the base of the HBT 22 and between the base and the collector of the HBT 22.

Further, a base of the HBT 21 is connected to a base bias circuit 27, a first line 28, and a first stub 29. A collector bias circuit 30, a second line 31, and a second stub 32 are connected between the collector of the HBT 22 and the output terminal. It is to be noted that the first line 28 and the first stub 29 form a resonant circuit.

The emitter of the HBT 21 is grounded through a third line 33.

The base bias circuit 27 and the collector bias circuit 30 have functions similar to those of the gate bias circuit 8 and the drain bias circuit 11, respectively, illustrated in FIG. 9.

The first stub 29 and the second stub 32 are a short stub and an open stub, respectively each length of which is λ/4 of an oscillation signal. By total reflection of an oscillation signal by these stubs, oscillation is made to grow.

With regard to a fundamental wave which is an oscillation signal, because it is reflected by the second stub 32, it is not output from the output terminal. With regard to a second harmonic of an oscillation signal, because it is open to the second stub 32, it is not affected by the second stub 32. Therefore, a second harmonic of an oscillation signal is output from the output terminal.

The first line 28, the second line 31, and the third line 33 are lines provided for adjusting the reflection gain and a reflection phase, and the lengths of the lines are set so as to satisfy oscillation conditions.

Here, let an impedance when the side of the transistor is seen from a surface A-A of FIG. 13 (on the right of FIG. 13) be $Z_{tr}$ and an impedance when the side of the resonant circuit is seen from the surface A-A (on the left of FIG. 13) be $Z_{res}$. Generally, the oscillation conditions are satisfied and oscillation occurs when the frequency satisfies both of the following Equations (1) and (2).

$$Re(Z_{tr})+Re(Z_{res})<0 \text{ and } Re(Z_{tr})<0 \quad (1)$$

$$Im(Z_{tr})+Im(Z_{res})=0 \quad (2)$$

Figure 14:
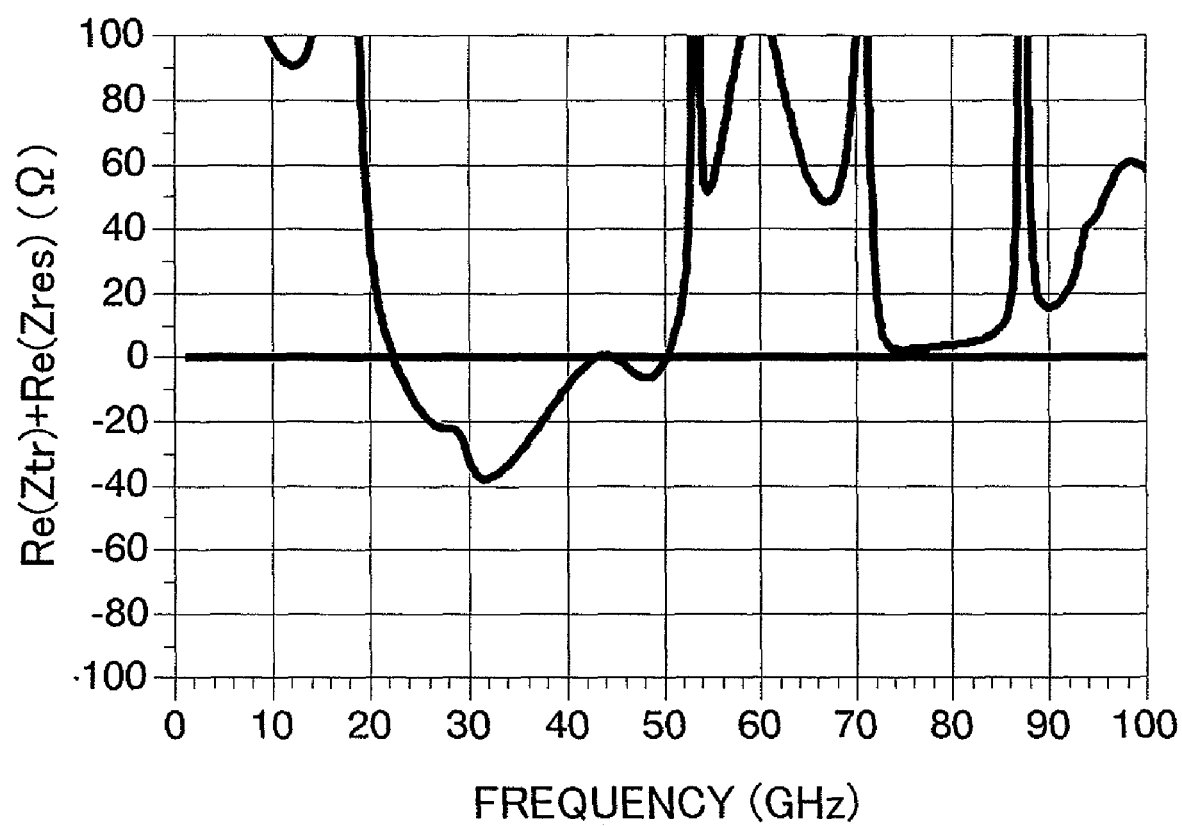
FIG. 14 is an explanatory graph of frequency characteristics of $Re(Z_{tr})+Re(Z_{res})$ in the oscillator illustrated in FIG. 13.
Figure 15:
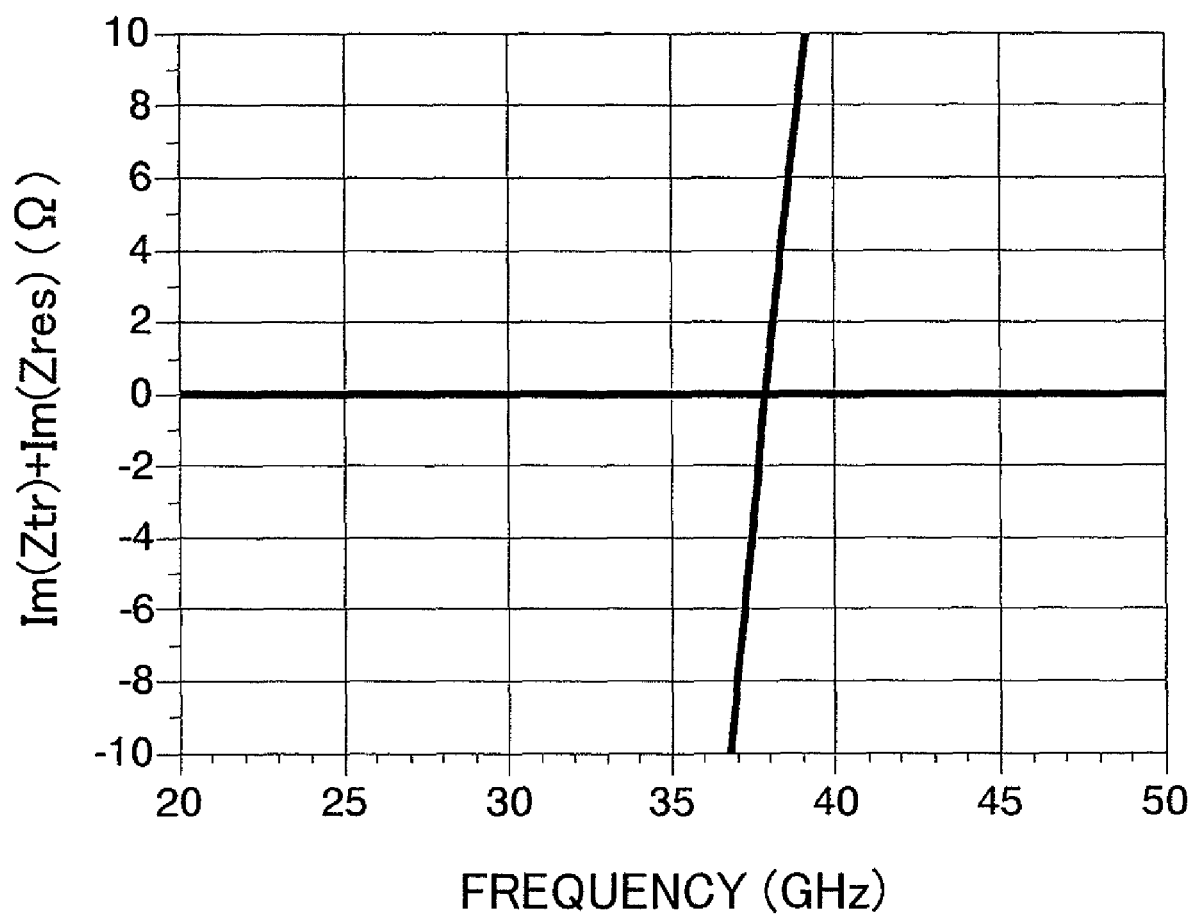
FIG. 15 is an explanatory graph of frequency characteristics of $Im(Z_{tr})+Im(Z_{res})$ in the oscillator illustrated in FIG. 13.

FIG. 14 is an explanatory graph of frequency characteristics of $Re(Z_{tr})+Re(Z_{res})$ in the oscillator illustrated in FIG. 13. FIG. 15 is an explanatory graph of frequency characteristics of $Im(Z_{tr})+Im(Z_{res})$ in the oscillator illustrated in FIG. 13.

With reference to FIGS. 14 and 15, Equation (1) is satisfied at a frequency band of about 20 to about 50 GHz, and Equation (2) is satisfied at about 38 GHz. Therefore, in the oscillator according to Embodiment 4, an oscillation signal at about 38 GHz is generated.

Next, the divider resistances 25 and 26 are described in detail.

Figure 16:
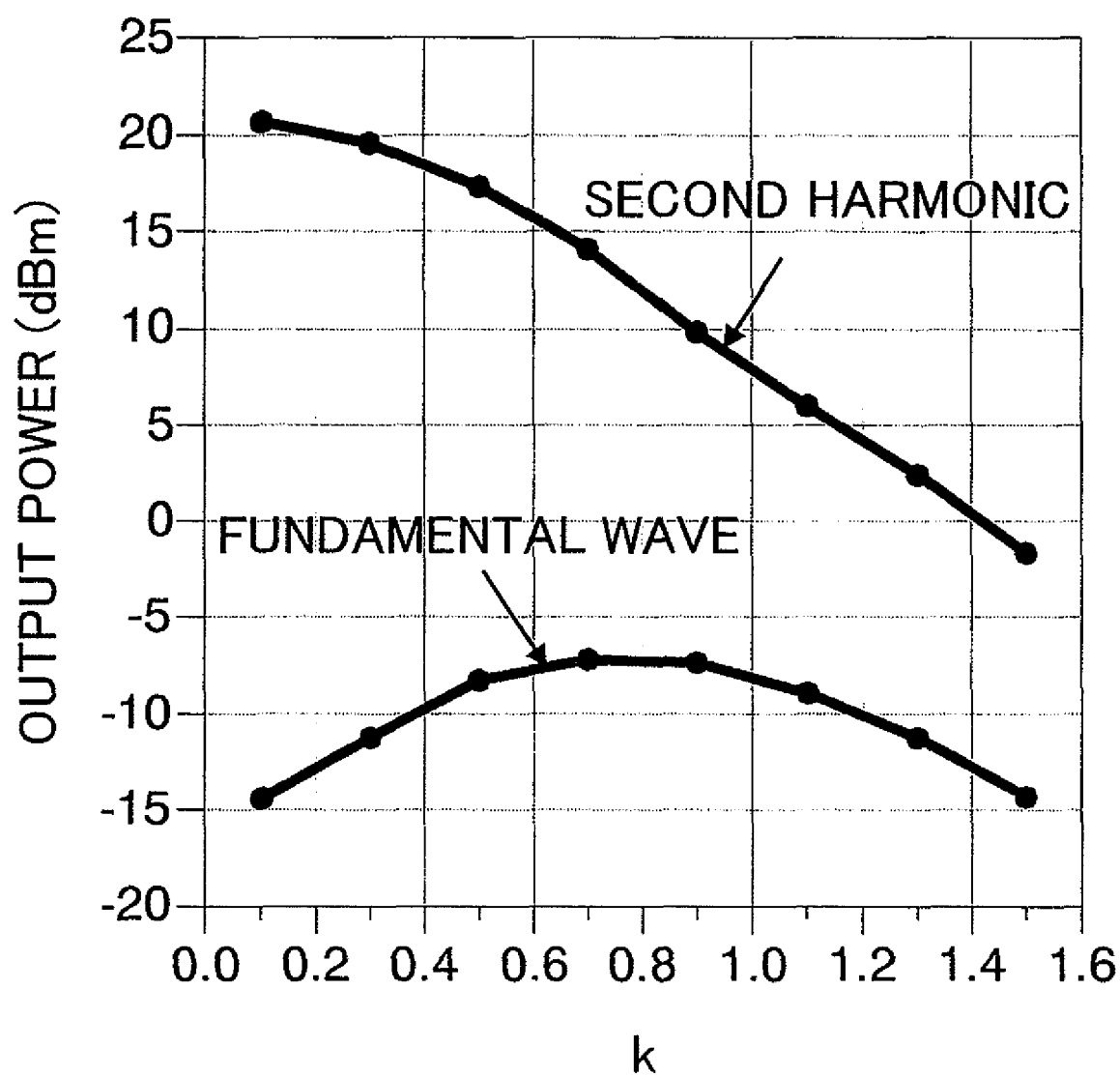
FIG. 16 is an explanatory graph showing a relationship between a resistance ratio of divider resistances and output power in the oscillator illustrated in FIG. 13 with regard to a fundamental wave and a second harmonic of an oscillation signal.

FIG. 16 is an explanatory graph showing the relationship between a resistance ratio k of the divider resistance 25 and the divider resistance 26 (k: resistance value of divider resistance 26/resistance value of divider resistance 25) and output power in the oscillator illustrated in FIG. 13 with regard to a fundamental wave and a second harmonic of an oscillation signal.

In FIG. 16, with regard to the fundamental wave, the output power is at the maximum when k is 0.7, while, with regard to the second harmonic, the output power becomes higher as k becomes smaller. Therefore, in Embodiment 4, k is set to be 0.1 to take out the second harmonic. It is to be noted that, when the fundamental wave is taken out, k may be set to be 0.7.

Next, the phase adjusting line 23 and the open stub 24 are described in detail.

As described above, the length of the open stub 24 is λ/4 of an oscillation signal, and an oscillation signal is short-circuited by the base of the HBT 22.

The phase adjusting line 23 adjusts the phase of a second harmonic to a desired phase in order to optimize the output power of a second harmonic of an oscillation signal.

Figure 17:
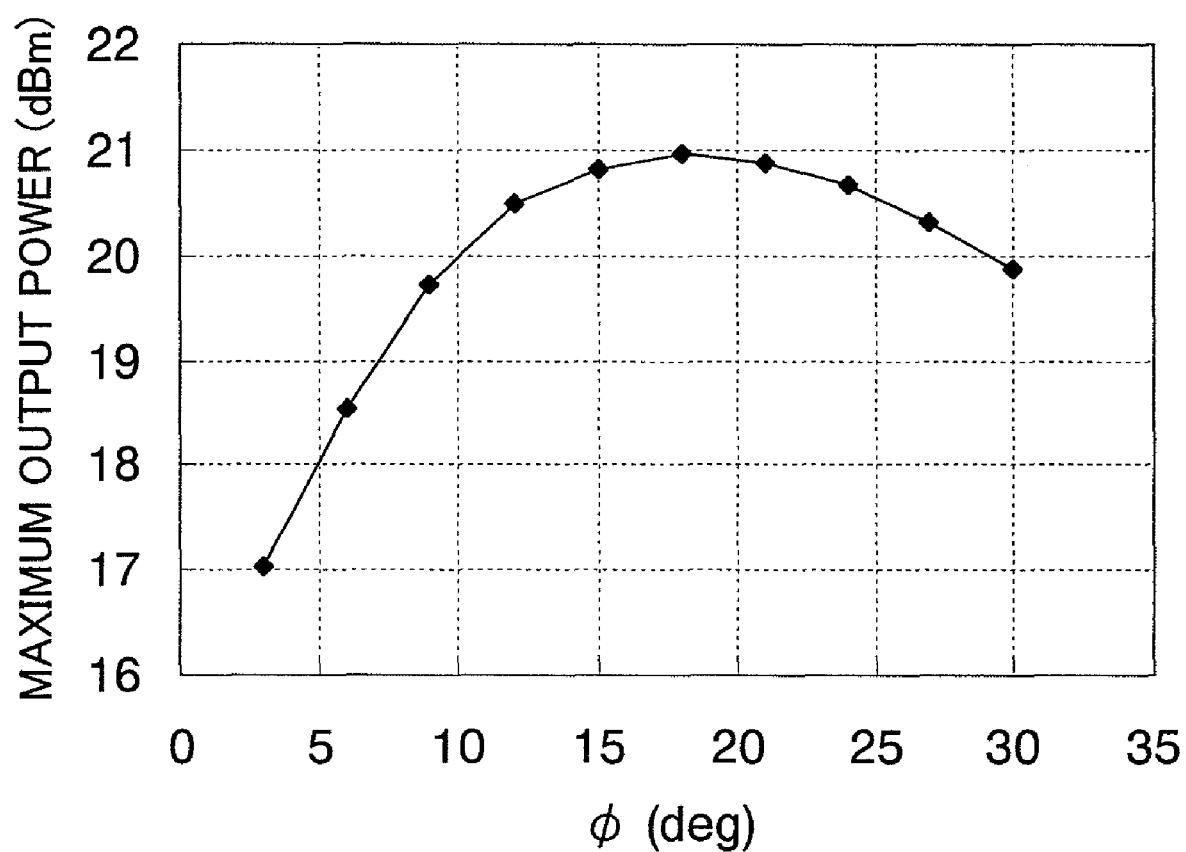
FIG. 17 is an explanatory graph showing a relationship between an electrical length of a phase adjusting line at an oscillation frequency and maximum output power of the second harmonic of an oscillation signal in the oscillator illustrated in FIG. 13.

FIG. 17 is an explanatory graph showing the relationship between an electrical length φ of the phase adjusting line 23 at the oscillation frequency (38 GHz) and maximum output power of the second harmonic (76 GHz) of an oscillation signal in the oscillator illustrated in FIG. 13.

Figure 18:
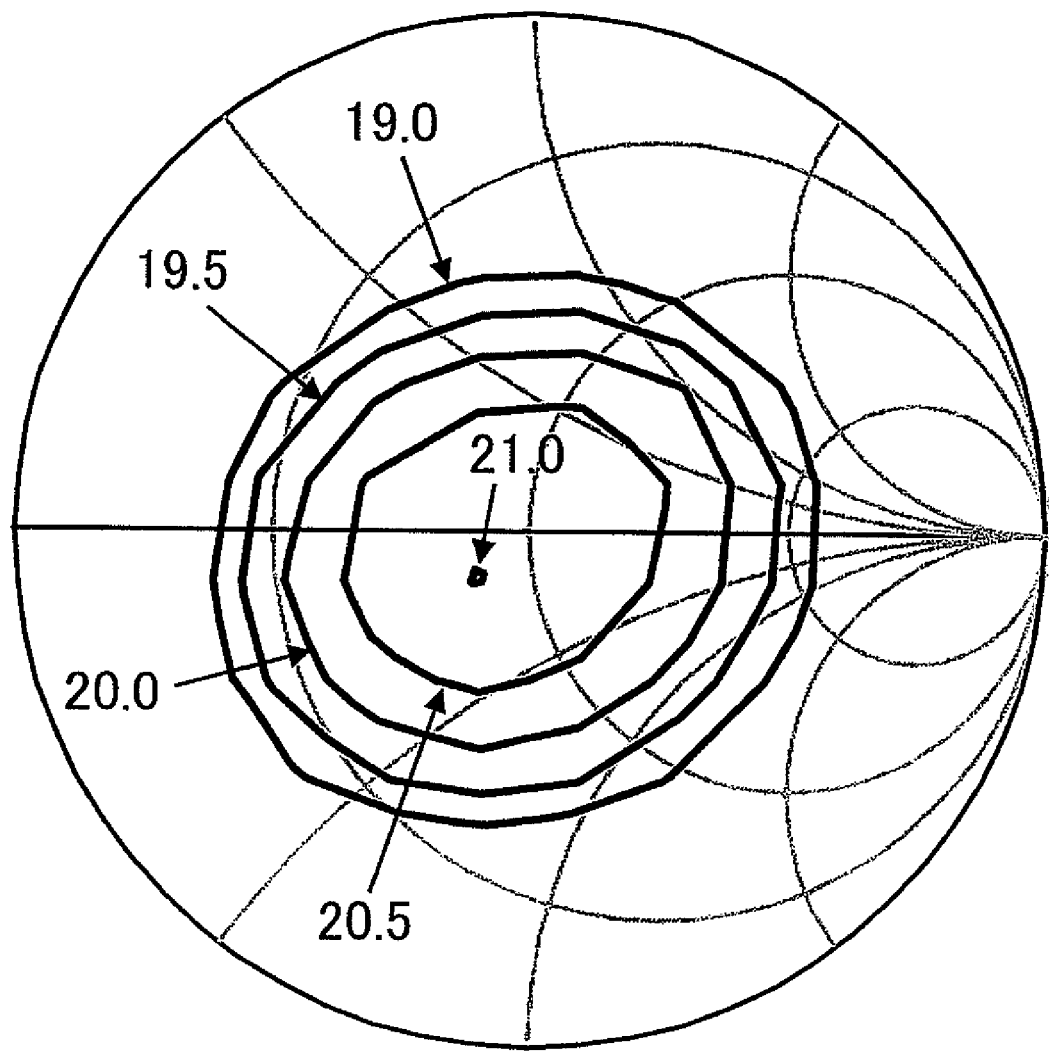
FIG. 18 is a contour map illustrating an output power of the second harmonic in the oscillator illustrated in FIG. 13 when the electrical length is 18°.

The maximum output power of a second harmonic is output power of the second harmonic at an optimum load impedance with regard to the respective electrical lengths. As an example, FIG. 18 is a contour map illustrating an output power of the second harmonic in the oscillator illustrated in FIG. 13 when the electrical length φ is 18°. It can be seen from FIG. 18 that maximum output power of 21 dBm can be obtained at about the center of the contour map. FIG. 17 plots maximum output power of the contour map with respect to the respective electrical lengths.

From FIG. 17, even when the phase adjusting line 23 is not connected (more specifically, φ=0°), high output of about 15 dBm can be obtained at the maximum. However, by shifting the phase of the second harmonic of the oscillation signal from the base of the HBT 22 by about 15-24°, the output power of the second harmonic can further be made higher. Therefore, in Embodiment 4, the electrical length φ is set to be 18°.

Figure 19:
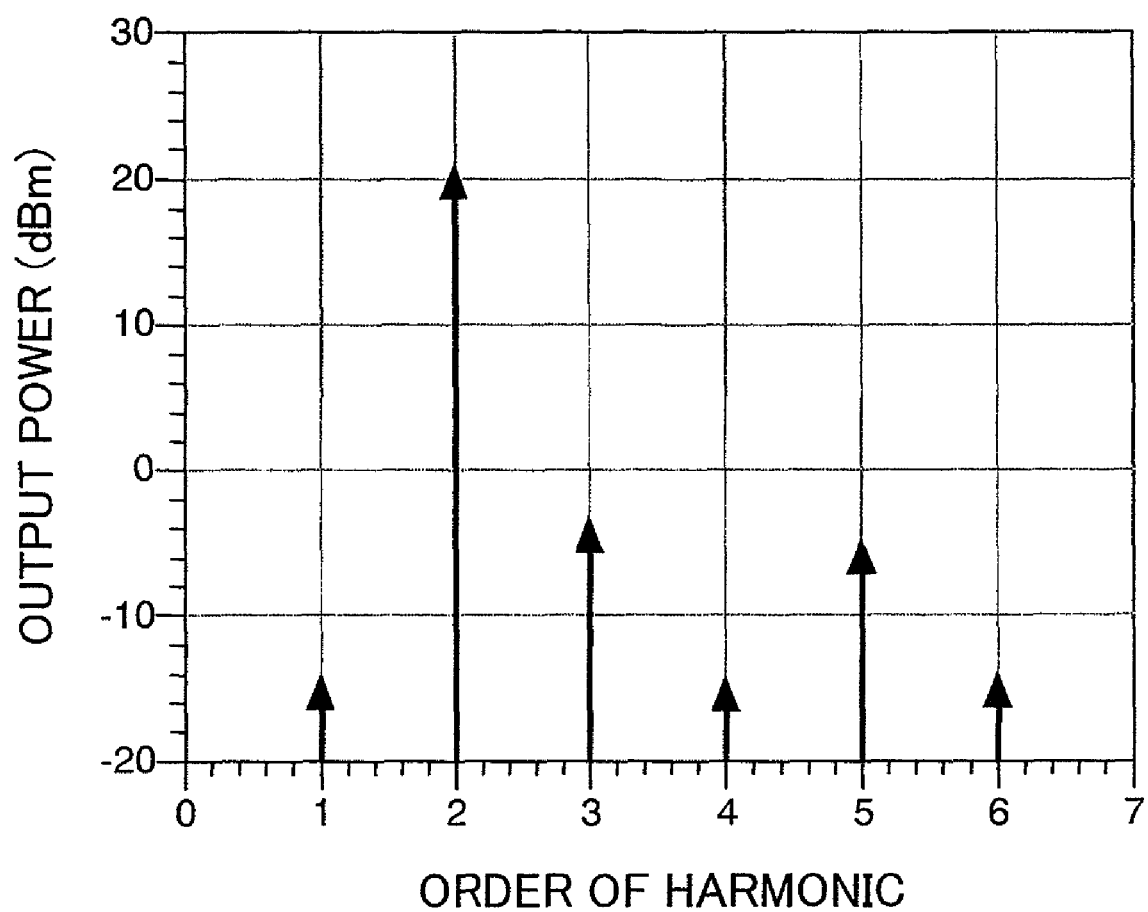
FIG. 19 is an explanatory graph of distribution of harmonics with regard to output power in the oscillator illustrated in FIG. 13.

FIG. 19 is an explanatory graph of distribution of harmonics (oscillation spectrum) with regard to output power in the oscillator illustrated in FIG. 13. In FIG. 19, the horizontal axis represents the order of the harmonic. For example, 1 means a fundamental wave and 2 means a second harmonic.

From FIG. 19, it can be seen that, in the oscillator which oscillates at about 38 GHz, the output power of a second harmonic of an oscillation signal is 21 dBm.

In this way, by using the phase adjusting line 23 and the open stub 24, a negative resistance |Re($Z_{tr}$)| can be made satisfactory high, and, because the output power of the second harmonic of the oscillation signal can be optimized, the output power can be increased at the maximum.

In the oscillator according to Embodiment 4 of the present invention, the first transistor and the second transistor are cascode-connected, and the base of the second transistor is connected to the phase adjusting line for adjusting the phase of an input signal to a desired phase. The open stub for short-circuiting high-frequency signals in the predetermined frequency including the vicinity of the frequency is connected to the side of the phase adjusting line which is opposite to the second transistor.

Therefore, a high-output oscillator at the millimeter-wave band can be obtained.

Further, because the negative resistance |Re($Z_{tr}$)| is determined not by the capacitance of a capacitor which varies greatly in characteristics but by the length of the stub, manufacturing variations of the oscillator can be suppressed.

It is to be noted that, although, in Embodiment 4, only the open stub 24 the length of which is λ/4 of an oscillation signal is connected to the side of the phase adjusting line 23 which is opposite to the HBT 22, the present invention is not limited thereto, and an open stub for a second harmonic (open stub for nth harmonic) the length of which is λ/4 of a second harmonic of an oscillation signal may be further connected. Further, together with the phase adjusting line 23, a phase adjusting line for adjusting the phase of an oscillation signal to a desired phase may be connected.

In this case, the output power of the second harmonic of the oscillation signal can be further improved.

When the frequency to be used ranges over a plurality of bands, similarly to the case of Embodiment 1, an appropriate open stub may be selected among a plurality of open stubs using the selector switch 41 (see FIG. 4), or, a variable length stub the length of which can be adjusted by the MEMS switch 42 may be used to change the frequency band to be used (see FIG. 5).

Embodiment 5

Although, in Embodiment 4, using the open stub 24, the oscillation signal is short-circuited by the base of the HBT 22, the present invention is not limited thereto.

In the following, a structure in which an oscillation signal is short-circuited using a short stub is described. It is to be noted that, instead of the open stub or the short stub, a series resonant circuit adapted to resonate at the oscillation frequency of an oscillation signal may be used.

Figure 20:
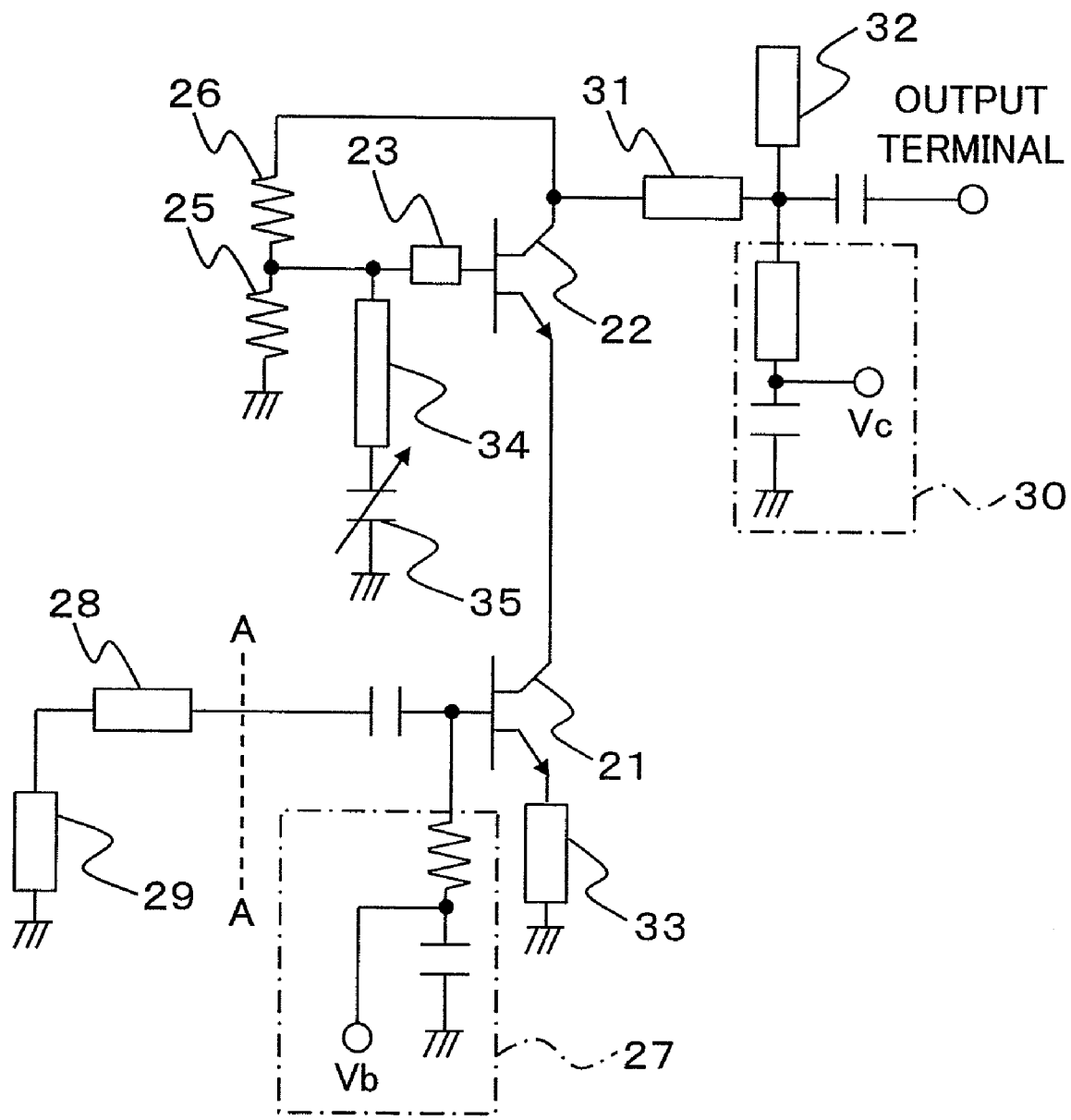
FIG. 20 is a circuit diagram illustrating an oscillator according to Embodiment 5 of the present invention.

FIG. 20 is a circuit diagram illustrating an oscillator according to Embodiment 5 of the present invention. It is to be noted that the oscillator is adapted to output a second harmonic of an oscillation signal. Description of structures and functions similar to those described in Embodiment 4 is omitted.

In FIG. 20, a base of an HBT 22 is connected to one end of a short stub 34 (filter circuit) instead of the open stub 24 illustrated in FIG. 13. The short stub 34 short-circuits high-frequency signals in a predetermined frequency including the vicinity of the frequency. Here, the length of the short stub 34 is set to be ½ the wavelength (λ/2) of an oscillation signal the oscillation frequency of which is the predetermined frequency. It is to be noted that the length of the short stub 34 may be set to be λ/2 of a harmonic of an oscillation signal.

The other end of the short stub 34 is grounded through a variable-capacitance capacitor 35 for filtering out a direct current signal.

It is to be noted that, because the oscillation frequency of the oscillator varies depending on the capacitance of the capacitor connected to the other end of the short stub 34, by using the variable-capacitance capacitor 35, the oscillation frequency can be made variable.

Figure 21:
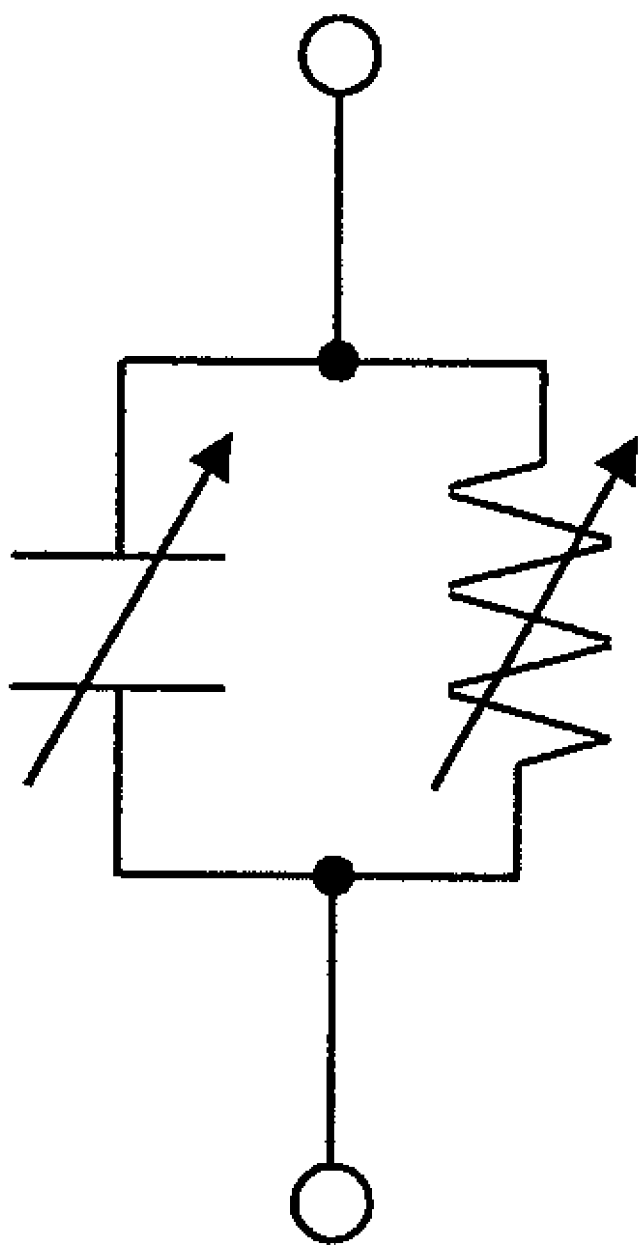
FIG. 21 is an equivalent circuit diagram of a typical diode.

Further, as the variable-capacitance element, a diode, for example, may be used instead of the capacitor. The diode can be regarded as a circuit in which a variable-capacitance capacitor and a variable resistance are connected in parallel as an equivalent circuit diagram illustrated in FIG. 21.

When a reverse voltage is applied to the diode, the resistance becomes several kiloohms or more, and thus, a high-frequency signal is greatly affected by a variable capacitance. Therefore, when a diode is used as the variable-capacitance element, a voltage controlled oscillator which can control the oscillation frequency by the voltage applied to the diode can be formed.

Figure 22:
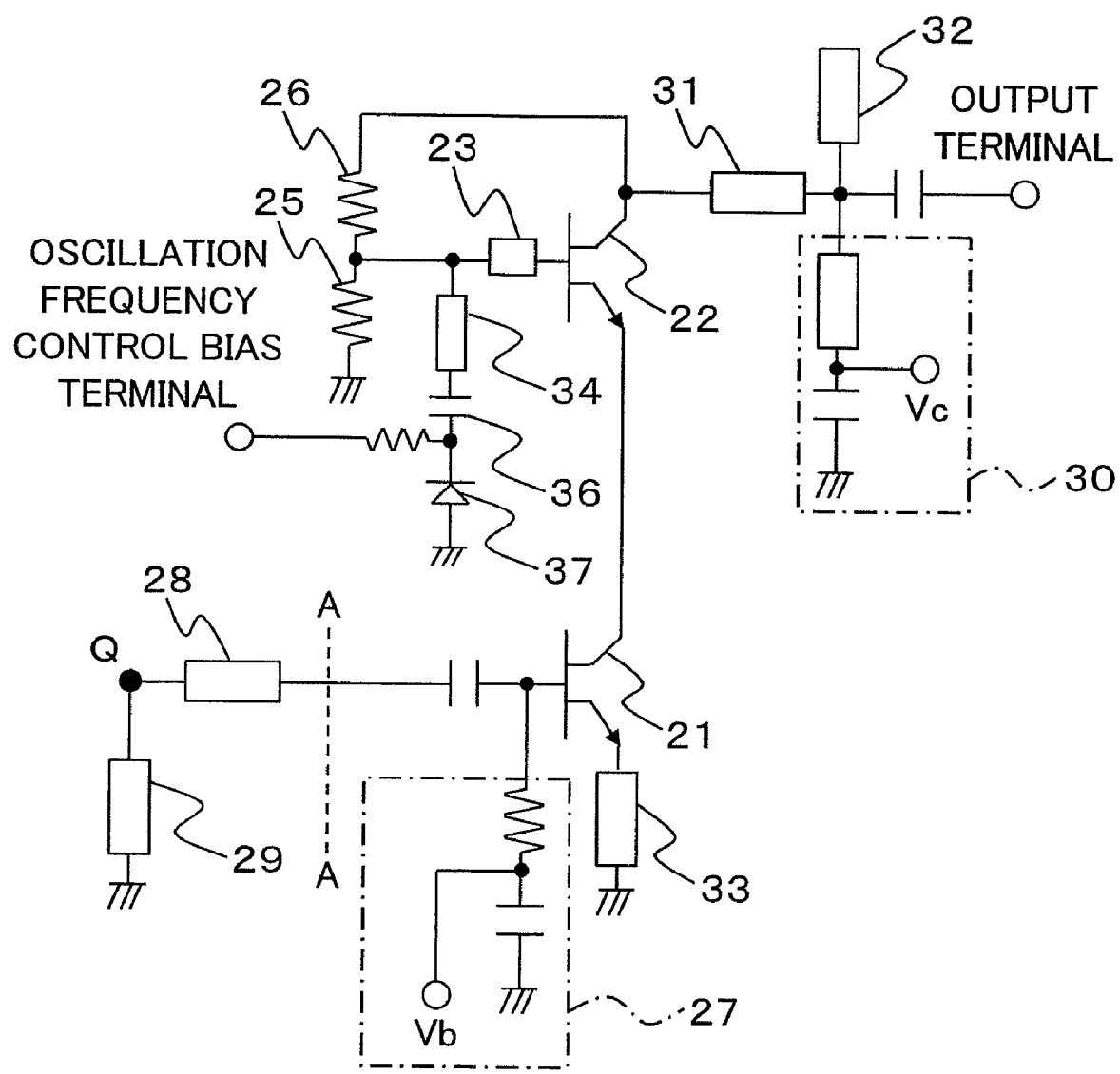
FIG. 22 is a circuit diagram illustrating another oscillator according to Embodiment 5 of the present invention.

Here, FIG. 22 is a circuit diagram illustrating a voltage controlled oscillator as the oscillator illustrated in FIG. 20 formed using a diode as the variable-capacitance element.

In FIG. 22, a base of an HBT 22 is connected to a capacitor 36 and a diode 37 instead of the variable-capacitance capacitor 35 illustrated in FIG. 20. It is to be noted that the capacitor 36 is connected for the purpose of filtering out a direct current signal.

An oscillation frequency control bias terminal to which a signal for controlling the oscillation frequency is input is connected between the capacitor 36 and the diode 37.

Figure 23:
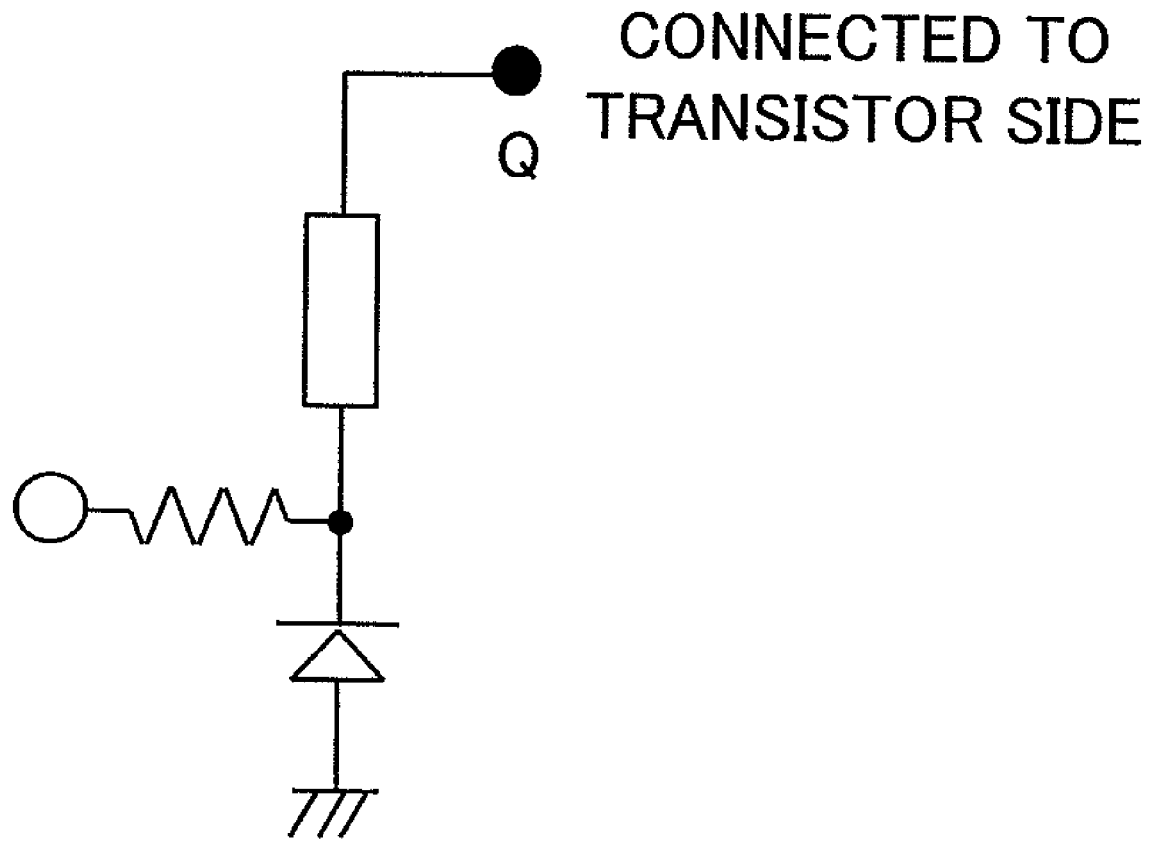
FIG. 23 is a circuit diagram illustrating a capacitor for controlling an oscillation frequency of an oscillator.
Figure 24:
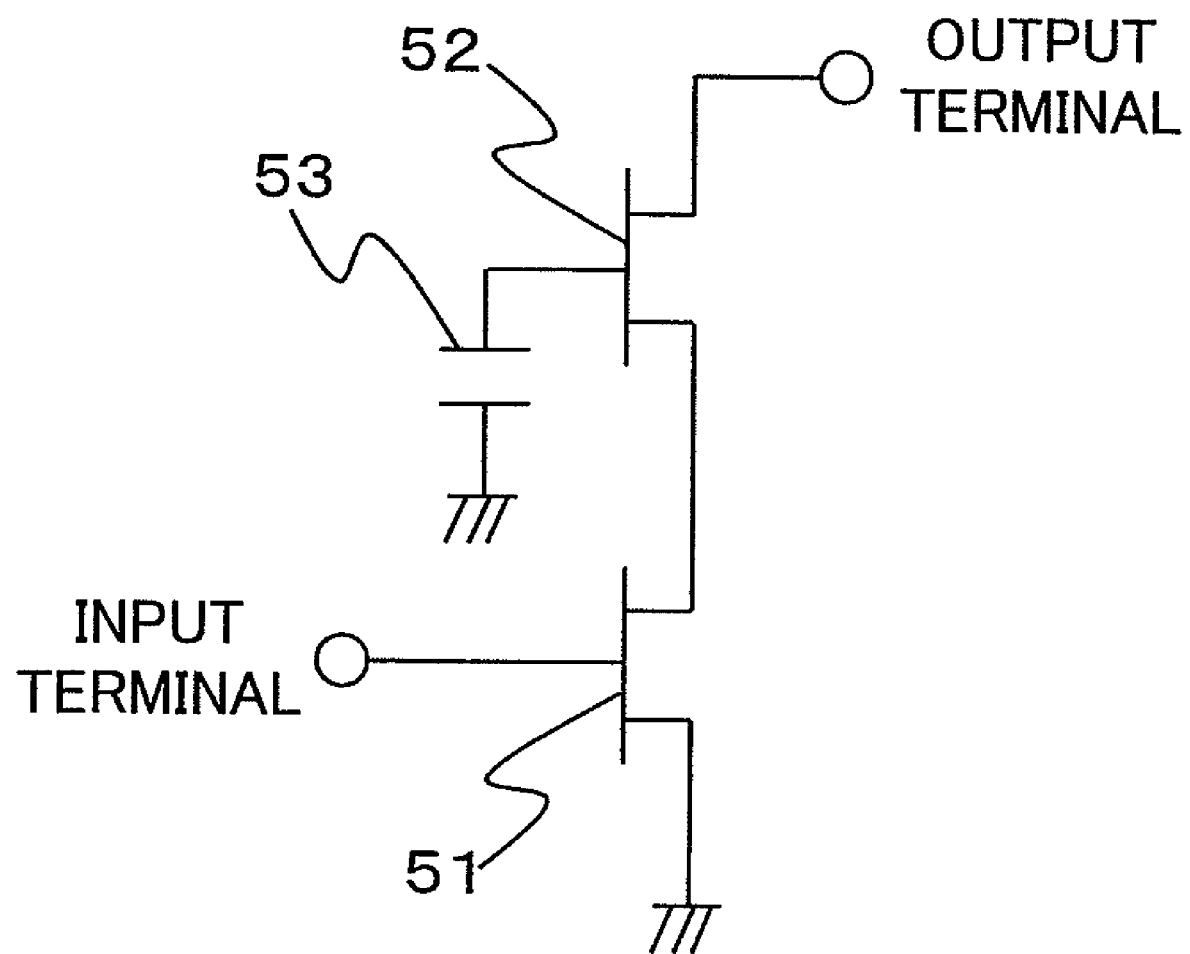
FIG. 24 is a circuit diagram illustrating a conventional cascode circuit.
Figure 25:
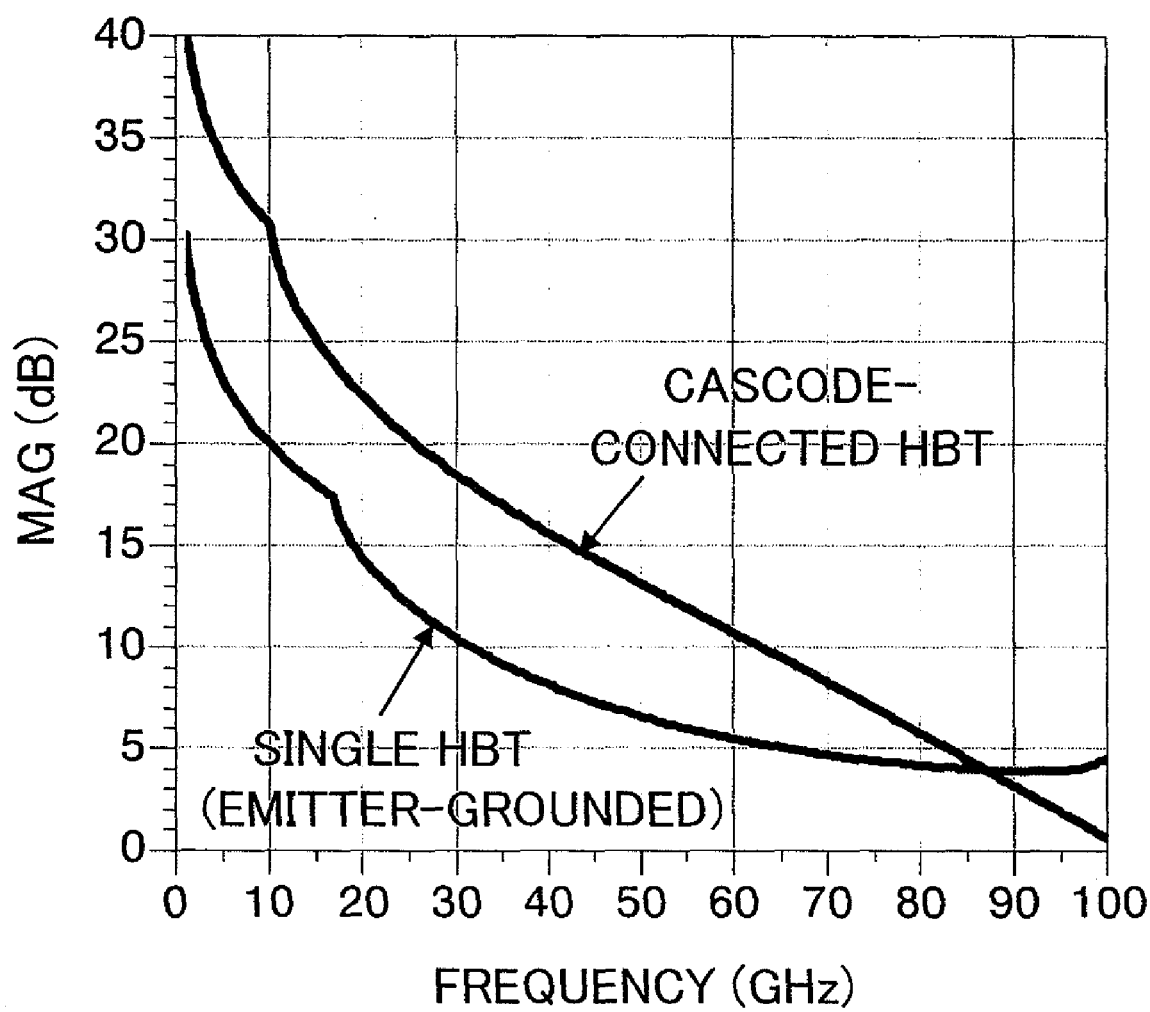
FIG. 25 is an explanatory graph of frequency characteristics of a MAG in a single emitter-grounded HBT and in a cascode-connected HBT.
Figure 26:
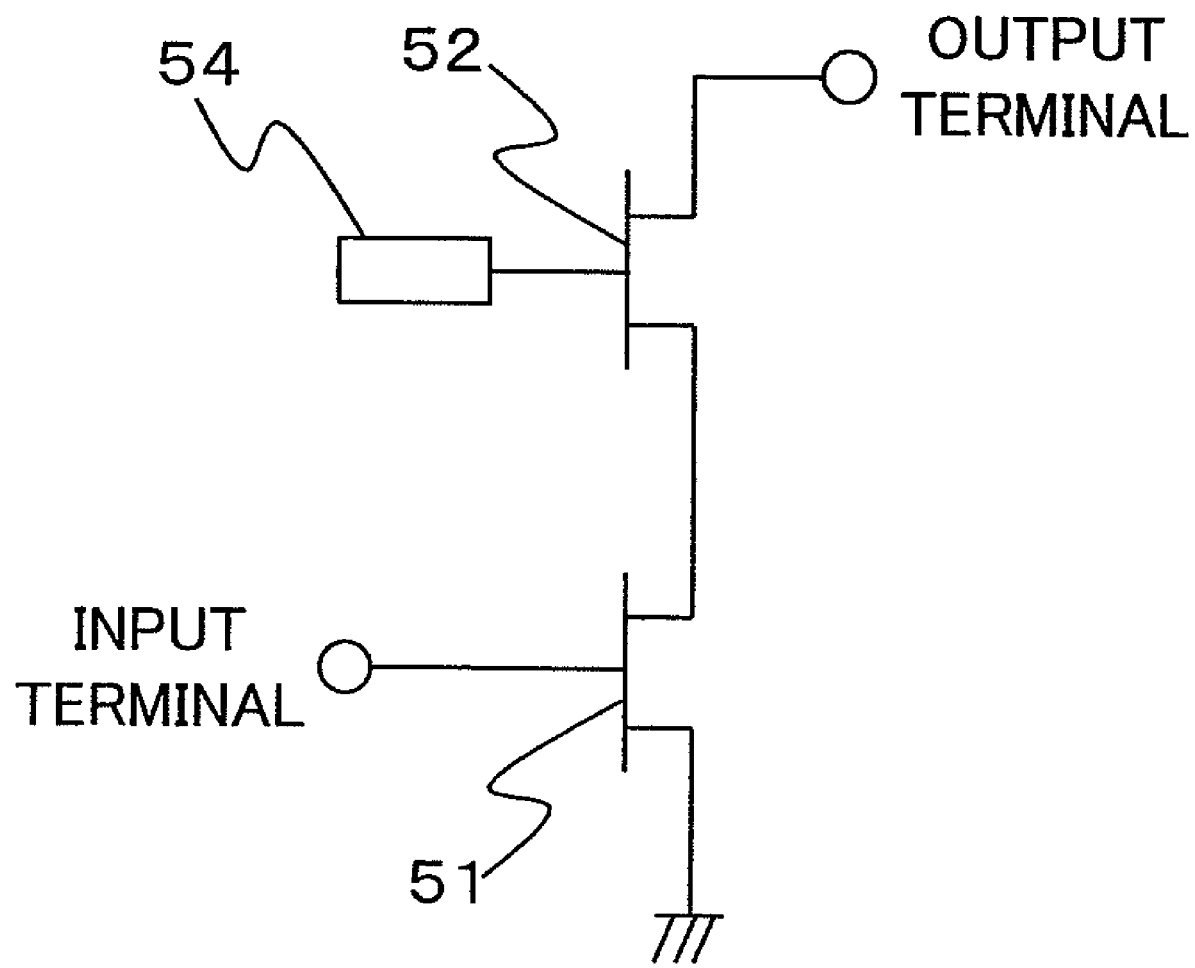
FIG. 26 is a circuit diagram illustrating another conventional cascode circuit.
Figure 27:
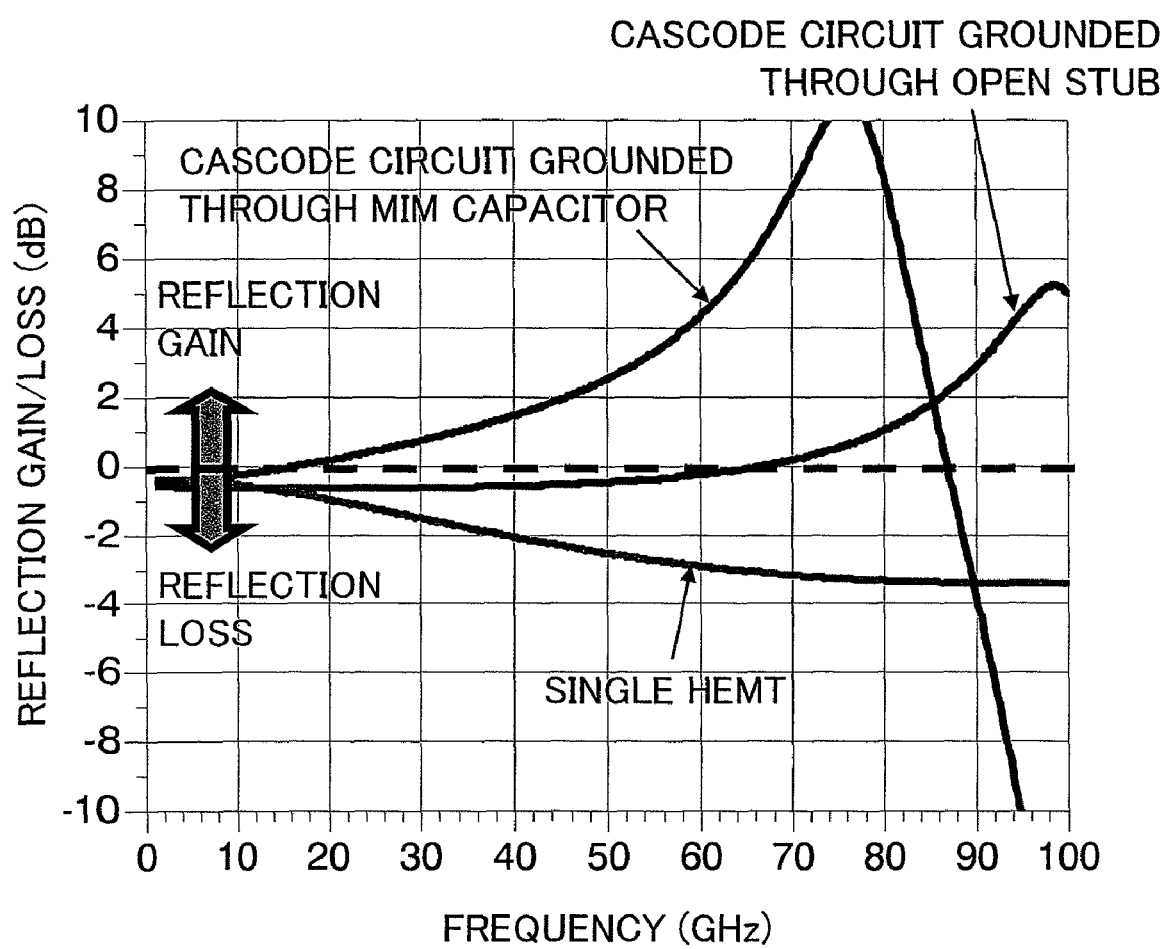
FIG. 27 is an explanatory graph of frequency characteristics of a reflection gain/loss on an output side in a single HEMT, a cascode circuit in which a gate of a second transistor is grounded through a MIM capacitor, and a cascode circuit in which a gate of a second transistor is grounded through an open stub.

In a conventional voltage controlled oscillator, a capacitor (varactor) for controlling the oscillation frequency as illustrated in FIG. 23 is connected to a point Q of FIG. 22. However, in this case, there is a problem that an impedance Re($Z_{res}$) when the side of the resonant circuit is seen from a surface A-A of FIG. 22 (on the left of FIG. 13) becomes higher and it is difficult that Equation (1) of the above-mentioned oscillation conditions is satisfied.

In Embodiment 5, by connecting the varactor to the base of the HBT 22, a voltage controlled oscillator having a simpler circuit structure can be obtained without increasing the impedance Re($Z_{res}$).

In the oscillator according to Embodiment 5 of the present invention, the first transistor and the second transistor are cascode-connected, and the base of the second transistor is connected to the phase adjusting line for adjusting the phase of an input signal to a desired phase. The open stub for short-circuiting high-frequency signals in the predetermined frequency including the vicinity of the frequency is connected to the side of the phase adjusting line which is opposite to the second transistor.

Therefore, a high-output oscillator at the millimeter-wave band can be obtained.

Further, by grounding the other end of the short stub through the diode, a voltage controlled oscillator having a simple circuit structure can be obtained.

It is to be noted that, although, in Embodiment 5, only the short stub 34 the length of which is λ/2 of an oscillation signal is connected to the side of the phase adjusting line 23 which is opposite to the HBT 22, the present invention is not limited thereto, and a short stub for a second harmonic (open stub for nth harmonic) the length of which is λ/2 of a second harmonic of an oscillation signal may be further connected. Further, together with the phase adjusting line 23, a phase adjusting line for adjusting the phase of an oscillation signal to a desired phase may be connected.

Instead of the short stub for a second harmonic, an open stub for a second harmonic the length of which is λ/4 of a second harmonic of an oscillation signal may be connected together with a corresponding phase adjusting line.

In those cases, the output power of the second harmonic of the oscillation signal can be further improved.

Further, when the impedance shifts from its optimum value by connecting the varactor and the capacitor 36, the length of the short stub 34 may be appropriately changed from λ/2 such that the output becomes optimum.

What is claimed is:

1. A cascode circuit including two cascode-connected transistors, comprising:
    a first transistor including,
        as a first terminal, one of a source and an emitter, the first terminal being grounded, and,
        as a second terminal, one of a drain and a collector;
    a second transistor including,
        as a first terminal, one of a source and an emitter, the first terminal being connected to the second terminal of the first transistor,
        as a second terminal, one of a gate and a base, and,
        as a third terminal, one of a drain and a collector;
    a signal improving circuit connected to the second terminal of the second transistor, for improving and outputting an input signal input to the signal improving circuit; and
    a filter circuit connected to a side of the signal improving circuit which is opposite a side of the signal improving circuit that is connected to the second transistor, for short-circuiting high-frequency signals at a predetermined frequency, including at frequencies near the predetermined frequency.

2. The cascode circuit according to claim 1, wherein the filter circuit comprises a series resonant circuit including an inductor and a capacitor connected in series.

3. The cascode circuit according to claim 1, wherein the filter circuit comprises an open stub.

4. The cascode circuit according to claim 3, wherein the open stub has a length substantially ¼ of the wavelength of a signal at the predetermined frequency.

5. The cascode circuit according to claim 3, wherein the open stub comprises a variable length stub having a length which can be adjusted by a micro electro mechanical system switch.

6. The cascode circuit according to claim 3, further comprising:
    a plurality of the open stubs; and
    a selector switch for selecting one of the open stubs to be used from among the plurality of open stubs.

7. The cascode circuit according to claim 1, wherein the filter circuit comprises a short stub.

8. The cascode circuit according to claim 6, wherein the short stub has a length substantially ½ of the wavelength of a signal at the predetermined frequency.

9. The cascode circuit according to claim 7, further comprising:
    a plurality of the short stubs; and
    a selector switch for selecting one of the short stubs to be used from among the plurality of short stubs.

10. The cascode circuit according to claim 1, wherein the second transistor comprises a multistage transistor.

11. The cascode circuit according to claim 1, wherein the first transistor and the second transistor comprise a dual-gate high electron mobility transistor.

12. The cascode circuit according to claim 1, further comprising:
    a first diode including an anode that is grounded and a cathode connected to the second terminal of the second transistor; and
    a second diode including an anode connected to the second terminal of the second transistor and a cathode connected to the third terminal of the second transistor.

13. The cascode circuit according to claim 1, wherein the signal improving circuit comprises a resistor for restricting reflection gain.

14. The cascode circuit according to claim 1, wherein the signal improving circuit comprises a phase adjusting line for adjusting phase of the input signal.

15. The cascode circuit according to claim 14, further comprising an open stub for an nth harmonic which has a length of substantially ¼ of the wavelength of an nth (n is an integer and at least 2) harmonic of a signal at the predetermined frequency and is connected to a side of the phase adjusting line which is opposite a side of the phase adjusting circuit connected to the second transistor.

16. The cascode circuit according to claim 14, further comprising a short stub for an nth harmonic which has a length of substantially ½ of the wavelength of an nth (n is an integer and at least 2) harmonic of a signal at the predetermined frequency and is connected to a side of the phase adjusting line which is opposite a side of the phase adjusting circuit connected to the second transistor.

* * * * *